(12) United States Patent
Mania et al.

(10) Patent No.: US 10,256,776 B1
(45) Date of Patent: Apr. 9, 2019

(54) STEERED CURRENT SOURCE FOR SINGLE-ENDED CLASS-A AMPLIFIER

(71) Applicant: WESTERN ELECTRIC EXPORT CORPORATION, Rossville, GA (US)

(72) Inventors: Guenther Mania, Pfinztal (DE); Charles George Whitener, Jr., Lookout Mountain, GA (US)

(73) Assignee: Western Electric Export Corporation, Rossville, GA (US)

( * ) Notice: Subject to any disclaimer, the term of this patent is extended or adjusted under 35 U.S.C. 154(b) by 0 days.

(21) Appl. No.: 16/116,015

(22) Filed: Aug. 29, 2018

(51) Int. Cl.
*H03F 1/04* (2006.01)
*H03F 3/30* (2006.01)
*H04R 3/00* (2006.01)
*H03F 3/181* (2006.01)

(52) U.S. Cl.
CPC .............. *H03F 3/181* (2013.01); *H03F 1/04* (2013.01); *H03F 3/30* (2013.01); *H04R 3/00* (2013.01); *H03F 2200/03* (2013.01); *H03F 2200/541* (2013.01)

(58) Field of Classification Search
CPC ... H03F 3/181; H03F 1/04; H03F 3/30; H03F 2200/03; H03F 2200/541; H04R 3/00
USPC ........................................................ 381/120
See application file for complete search history.

(56) References Cited

U.S. PATENT DOCUMENTS

| | | | | |
|---|---|---|---|---|
| 2002/0036519 A1* | 3/2002 | Krishnapura | ......... | H03F 1/0266 327/65 |
| 2009/0058393 A1* | 3/2009 | Huang | .................. | H02J 7/0052 323/316 |
| 2009/0195313 A1* | 8/2009 | Muller | ................ | H03F 3/45183 330/261 |
| 2012/0155675 A1* | 6/2012 | Froehlich | ................ | H03F 1/523 381/120 |
| 2015/0155843 A1* | 6/2015 | Scott | ..................... | H03F 1/0272 330/285 |

OTHER PUBLICATIONS

Olson, Lynn, "Ultrapath, Parallel Feed and Western Electric," Vacuum Tube Valley, Issue 16, 2001, pp. 4-9.

(Continued)

*Primary Examiner* — Paul Kim
*Assistant Examiner* — Friedrich Fahnert
(74) *Attorney, Agent, or Firm* — Patterson Intellectual Property Law, P.C.; Jerry Turner Sewell

(57) ABSTRACT

A single-ended Class-A amplifier includes an amplification component (e.g., a vacuum tube) having at least an output terminal, a reference terminal and a control terminal. The control terminal receives a time-varying input signal. The amplification component responds to the time-varying input signal to vary an output voltage on the output terminal and to vary a current flowing between the output terminal and the reference terminal. A load is AC-coupled to the output terminal. A steered current source has a voltage input coupled to the output terminal and has a steered current output coupled to the output terminal. The steered current source is configured to increase the steered current to provide current to the load when the output voltage on the output terminal of the amplification component increases and to decrease the steered current when the output voltage on the output terminal of the amplification component decreases.

12 Claims, 15 Drawing Sheets

(56) References Cited

OTHER PUBLICATIONS

Steve [no family name provided], Different Kinds of Output Configurations, Nov. 22, 2010, (Archived by: https://web.archive.org/web/20101122104637/diyaudioprojects.com/mirror/members.aol.com/sbench/outstru.html), [Retrieved Nov. 28, 2018], 6 pages.
Tubelab, "Single Ended Output Stages," Sep. 16, 2013, (Archived by: https://web.archive.org/web/20130916061011/http://tubelab.com/articles/ideas/single-ended-output-stages/), [Retrieved Nov. 28, 2018], 7 pages.

* cited by examiner

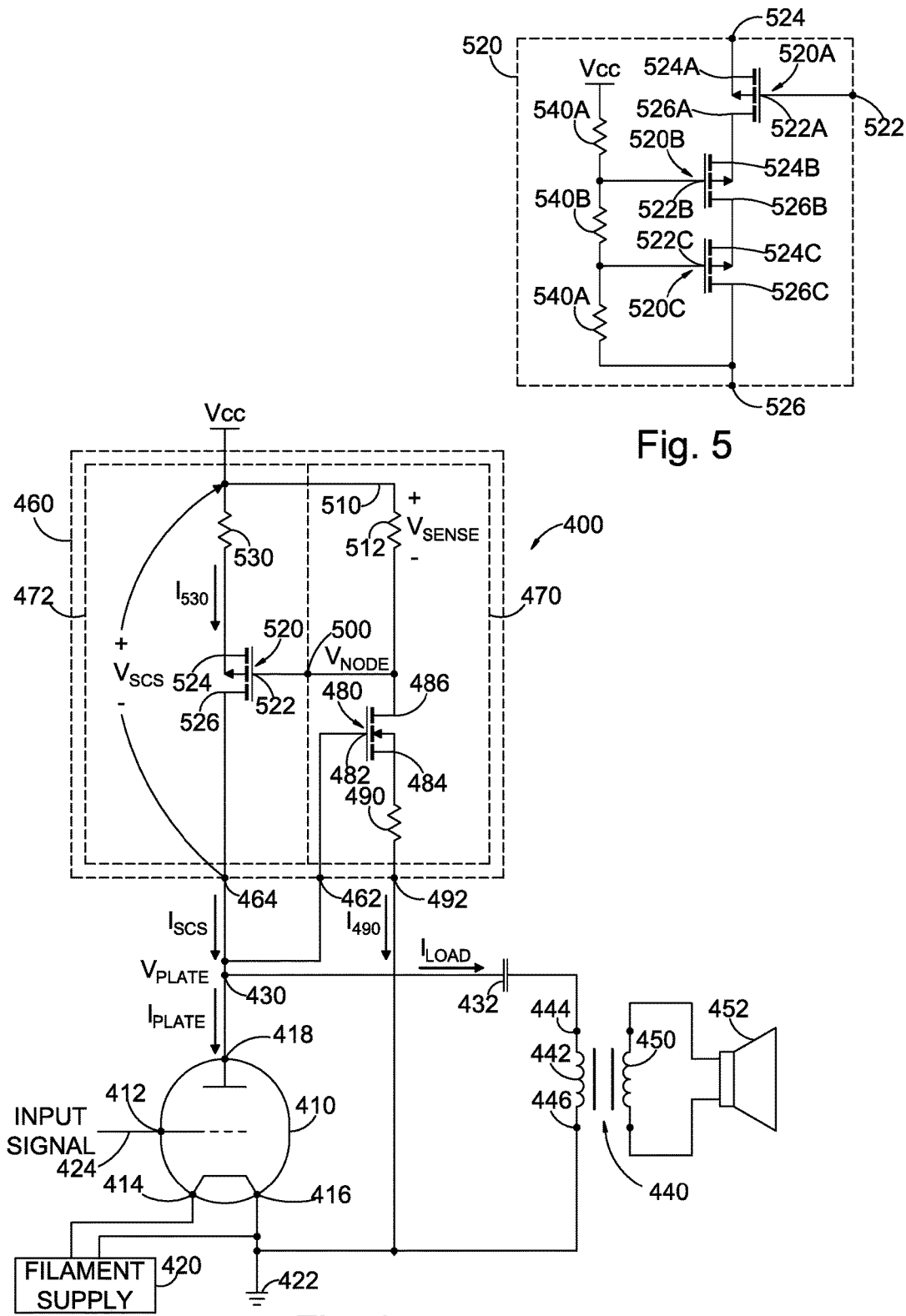

⟋—900

$V_{SUPPLY}$ =600 VOLTS $V_{IDLE}$ =600 VOLTS $I_{IDLE}$ =0.075 AMPERES $R_{LOAD}$ =∞

| $V_{PLATE}$ (VOLTS) | $I_{PLATE}$ (AMPERES) |
|---|---|
| 0 | 0.000 |
| 20 | 0.005 |
| 40 | 0.010 |
| 60 | 0.015 |
| 80 | 0.020 |
| 100 | 0.025 |
| 120 | 0.030 |
| 140 | 0.035 |
| 160 | 0.040 |
| 180 | 0.045 |
| 200 | 0.050 |
| 220 | 0.055 |
| 240 | 0.060 |
| 260 | 0.065 |
| 280 | 0.070 |
| 300 | 0.075 |
| 320 | 0.080 |
| 340 | 0.085 |
| 360 | 0.090 |
| 380 | 0.095 |
| 400 | 0.100 |
| 420 | 0.105 |
| 440 | 0.110 |
| 460 | 0.115 |
| 480 | 0.120 |
| 500 | 0.125 |
| 520 | 0.130 |
| 540 | 0.135 |
| 560 | 0.140 |
| 580 | 0.145 |
| 600 | 0.150 |

$V_{SUPPLY}$ =600 VOLTS $V_{IDLE}$ =600 VOLTS $I_{IDLE}$ =0.075 AMPERES $R_{LOAD}$ =2,000 OHMS

| $V_{PLATE}$ (VOLTS) | $I_{PLATE}$ (AMPERES) |
|---|---|
| 0 | 0.150 |
| 20 | 0.145 |
| 40 | 0.140 |
| 60 | 0.135 |
| 80 | 0.130 |
| 100 | 0.125 |
| 120 | 0.120 |
| 140 | 0.115 |
| 160 | 0.110 |
| 180 | 0.105 |
| 200 | 0.100 |
| 220 | 0.095 |
| 240 | 0.090 |
| 260 | 0.085 |
| 280 | 0.080 |
| 300 | 0.075 |
| 320 | 0.070 |
| 340 | 0.065 |
| 360 | 0.060 |
| 380 | 0.055 |
| 400 | 0.050 |
| 420 | 0.045 |
| 440 | 0.040 |
| 460 | 0.035 |
| 480 | 0.030 |
| 500 | 0.025 |
| 520 | 0.020 |
| 540 | 0.015 |
| 560 | 0.010 |
| 580 | 0.005 |
| 600 | 0.000 |

Fig. 14

AC EQUIVALENT CIRCUIT

AC EQUIVALENT CIRCUIT

AC EQUIVALENT CIRCUIT

AC EQUIVALENT CIRCUIT

/1800

$V_{SUPPLY}$ = 600 VOLTS $V_{IDLE}$ = 600 VOLTS $I_{IDLE}$ = 0.075 AMPERES $R_{LOAD}$ = 4,000 OHMS

| $V_{PLATE}$ (VOLTS) | $I_{PLATE}$ (AMPERES) |
|---|---|
| 0 | 0.075 |
| 20 | 0.075 |
| 40 | 0.075 |
| 60 | 0.075 |
| 80 | 0.075 |
| 100 | 0.075 |
| 120 | 0.075 |
| 140 | 0.075 |
| 160 | 0.075 |
| 180 | 0.075 |
| 200 | 0.075 |
| 220 | 0.075 |
| 240 | 0.075 |
| 260 | 0.075 |
| 280 | 0.075 |
| 300 | 0.075 |
| 320 | 0.075 |
| 340 | 0.075 |
| 360 | 0.075 |
| 380 | 0.075 |
| 400 | 0.075 |
| 420 | 0.075 |
| 440 | 0.075 |
| 460 | 0.075 |
| 480 | 0.075 |
| 500 | 0.075 |
| 520 | 0.075 |
| 540 | 0.075 |
| 560 | 0.075 |
| 580 | 0.075 |
| 600 | 0.075 |

Fig. 18

STEERED CURRENT SOURCE FOR SINGLE-ENDED CLASS-A AMPLIFIER

FIELD OF THE INVENTION

The present disclosure relates generally to audio amplifiers, and, more particularly, relates to Class A audio amplifiers having a single amplifying element to drive a load.

BACKGROUND

For decades, vacuum tubes were incorporated into almost every aspect of electronic equipment, including audio amplifiers. With the advent of transistors followed by integrated circuits, vacuum tubes fell into disuse such that few, if any, modern televisions, radios, and similar electronic devices use vacuum tubes. However, a substantial group of "true" audiophiles consider the sound quality and performance of transistors and integrated circuits in audio equipment (e.g., stereo amplifiers) to be unsatisfactory because the sound from such modern amplifies tends to be cold and sterile. An increasing niche market exists for audio amplifiers having vacuum tubes in the power output stages.

Two major methods of power stage operation are used to implement vacuum tube amplifiers. The first major method of audio amplification is implemented as a single-ended amplifier. In a single-ended amplifier, a single power vacuum tube is provided for the final power output stage of each audio channel. In some embodiments, two or more vacuum tubes may be connected in parallel; however, the multiple tubes operate in unison as a single tube. Although the discussion herein is directed to a single vacuum tubes, it should be understood that the discussion encompasses multiple tubes connected in parallel. Because only a single vacuum tube is provided, the tube must handle (e.g., amplify) an entire input signal from a lowest input amplitude to a highest input amplitude. This operation is referred to as Class-A operation. The single vacuum tube is biased so that the tube conducts plate current throughout the entire 360 degrees of the AC cycle of the input signal and so that the tube is maintained in a highly linear range of operation at all times.

The second major method of audio amplification is implemented as a push-pull amplifier. In a push-pull amplifier, two tubes (or two sets of parallel tubes) work together; however, each tube operates during alternate AC half cycles of the input signal with respect to the other tube. Accordingly, each of the tubes in the push-pull amplifier performs half of the work of the single tube in the single-ended system. In the push-pull system, the two tubes are fed with an AC input signal; however, the signal fed to one tube is 180 degrees out of phase with the signal fed to the other tube. The two signals are otherwise identical and may be derived from a phase inverter. The outputs (e.g., the plates) of the two tubes in the push-pull amplifier are summed, for example, in a center tapped output power transformer. Because of the phasing of the input signals to the two tubes, the first tube, for example, increases conduction during one half cycle while the second tube decreases conduction. Then, during the next half cycle, the second tube increases conduction while the first tube decreases conduction. Effectively, one tube pushes current while the other tube pulls current into and out of the output power transformer.

In general, a push-pull amplifier provides better efficiency than a single-ended amplifier, however, many advocates of single-ended amplifiers assert that single-ended amplifiers provide a better sound but at a cost of reduced efficiency. Furthermore, singled-ended amplifiers are limited by the amount of power that can be provided by a singled tube without overheating the tube.

Known single-ended amplifiers are typically implemented with one of three circuit topologies. FIG. 1, for example, illustrates a circuit 100 that implements a conventional topology wherein a triode vacuum tube 110 has a grid terminal 112, a cathode terminal 114 and a plate terminal 116. The grid terminal is fed with an input signal to be amplified from an AC input signal source 118. The cathode terminal is connected to a circuit ground reference 124 via a cathode-biasing resistor 120 and a parallel-connected first AC-coupling capacitor 122. The idle current flowing through the biasing resistor biases the cathode to a positive voltage with respect to the grid terminal such that the grid is at a negative voltage with respect to the cathode. The cathode of the vacuum tube in the illustrated topology is biased to a desired idle operating point for the plate voltage and the plate current.

In FIG. 1, the plate terminal 116 of the triode vacuum tube 110 is connected to a first terminal 134 of a primary winding 132 of a power output transformer 130. A second terminal 136 of the primary winding is connected to the output ($V_{PLATE}+$) of a plate voltage source 140, which is referenced to the circuit ground reference 124. The second terminal of the primary winding is also connected to the circuit ground reference by a second AC-coupling capacitor 142 that allows AC signals to bypass the plate voltage source. A secondary winding 150 of the power output transformer is connected to an audio transducer (e.g., a loudspeaker) 152 or to another load.

The input signal applied to the grid terminal 112 of the vacuum tube 110 causes the plate voltage to vary about the idle operating point to cause an AC current to flow through the primary winding 132 and through the first and second AC-coupling capacitors 122, 142. The varying AC current through the primary winding induces a secondary voltage in the secondary winding 150, which causes current to flow through the loudspeaker (or other load) 152.

The circuit 100 of FIG. 1 operates well to amplify the input signal; however, all of the AC current flowing through the primary winding 132 must also flow through the vacuum tube 110 throughout the entire cycle of the input signal. Because the DC plate voltage and the DC idle current must also flow through the primary winding, the power output transformer 130 may require a gapped core to avoid saturation of the core.

A second known topology is a parallel feed ("parafeed") topology, which is represented by a circuit 200 in FIG. 2. The parallel feed topology includes a triode vacuum tube 210 having a grid terminal 212, a cathode terminal 214 and a plate terminal 216. The grid terminal is fed with an input signal to be amplified from an AC input signal source 218. The cathode terminal is connected to a circuit ground reference 224 via a cathode-biasing resistor 220 and a parallel-connected first AC-coupling capacitor 222. The idle current flowing through the biasing resistor biases the cathode to a positive voltage with respect to the grid terminal such that the grid is at a negative voltage with respect to the cathode. The cathode of the vacuum tube in the illustrated topology is biased to a desired idle operating point for the plate voltage and the plate current.

The plate terminal 216 of the vacuum tube 210 is connected to a first terminal 234 of a primary winding 232 of a power output transformer 230. A second terminal 236 of the primary winding is connected to the circuit ground reference 224 via a second AC-coupling capacitor 240. A secondary winding 250 of the power output transformer is connected to an audio transducer (e.g., a loudspeaker) 252 or to another load. A common connection node 260 between the plate terminal of the vacuum tube and the first terminal of the primary winding is connected to a first terminal 264 of an inductor 262. A second terminal 266 of the inductor is connected to a plate voltage ($V_{PLATE}+$) source 270, which is referenced to the circuit ground reference. Accordingly, the DC idle current for the vacuum tube is provided to the plate terminal via the inductor. The only current flowing through the primary winding of the power output transformer is an AC current resulting from changes in the plate voltage caused by the AC input signal applied to the grid terminal. Accordingly, the power output transformer can be smaller and simpler (e.g., no gap in the core).

In the circuit 200 of FIG. 2 implementing the parafeed topology, the inductor 260 inhibits AC current from passing through the plate voltage source 270. As in the circuit 100 of FIG. 1 implementing the conventional topology, the vacuum tube 200 of FIG. 2 in the parafeed topology must handle the AC current flowing through the primary winding throughout the entirety of each AC cycle.

A third known topology is a constant current source topology represented by a circuit 300 in FIG. 3. The constant current source topology includes a triode vacuum tube 310 having a grid terminal 312, a cathode terminal 314 and a plate terminal 316. The grid terminal is fed with an input signal to be amplified from an AC signal input source 318 via a first AC-coupling capacitor 320.

Unlike the biased cathodes of the two previously described circuits 100, 200, the cathode terminal 314 in the circuit 300 of FIG. 3 is connected directly to a circuit ground reference 330. The grid terminal 312 is biased to an idle grid voltage via a grid bias resistor 332 connected to the output of a grid bias voltage source 334. The grid bias voltage source is referenced to the circuit ground reference. As illustrated, the grid bias voltage source produces a negative voltage (e.g., having a magnitude of 45 volts) with respect to the circuit ground reference to establish an idle condition for the plate voltage (e.g., approximately 300 volts for a configuration where the maximum plate voltage is approximately 600 volts).

The plate terminal 316 of the vacuum tube 310 is connected to a first terminal 344 of the primary winding 342 of a power output transformer 340. A second terminal 346 of the primary winding is connected to the circuit ground reference 330 via a second AC-coupling capacitor 348. A secondary winding 350 of the power output transformer is connected to an audio transducer (e.g., a loudspeaker) 352 or to another load.

A common connection node 360 between the plate terminal 316 of the vacuum tube 310 and the first terminal 344 of the primary winding 342 of the power output transformer 340 is connected to an output terminal 372 of a constant current source 370. A second terminal 374 of the constant current source is connected to a plate voltage ($V_{PLATE}+$) source 380, which is referenced to the circuit ground reference 330. A constant DC idle current for the vacuum tube is provided to the plate terminal from the constant current source. The only current flowing through the primary winding of the power output transformer is an AC current resulting from changes in the plate voltage caused by the AC input signal applied to the grid terminal. Accordingly, the power output transformer can be smaller and simpler (e.g., no gap in the core).

In the circuit 300 of FIG. 3 implementing the constant current source topology, the constant current source 370 provides a current corresponding to the desired idle current of the vacuum tube 310 at all times. When the plate voltage increases in response to a more positive input signal applied to the grid terminal 312, a portion of the current output by the constant current source is provided to the primary winding 342 of the power output transformer 340, which reduces the current flow through the vacuum tube. On the other hand, when the plate voltage decreases, the plate current increases to sink both the full magnitude of the output of the constant current source as well as the current from the primary winding. Accordingly, the total power consumption of the vacuum tube includes power generated by the additional current from the constant current source flowing through the vacuum tube. The additional power consumed by the vacuum tube reduces the amount of amplification provided by the vacuum tube because the total power must be maintained below a safe power level for the vacuum tube.

BRIEF SUMMARY

Accordingly, a need exists for single-ended Class-A amplifier circuit that provides increased power to a load without stressing a vacuum tube or other amplification component.

An aspect of the embodiments disclosed herein is a single-ended Class-A amplifier that includes an amplification component (e.g., a vacuum tube) having at least an output terminal, a reference terminal and a control terminal. The control terminal receives a time-varying input signal. The amplification component responds to the time-varying input signal to vary an output voltage on the output terminal and to vary a current flowing between the output terminal and the reference terminal. A load is AC-coupled to the output terminal. A steered current source has a voltage input coupled to the output terminal and has a steered current output coupled to the output terminal. The steered current source is configured to increase the steered current to provide current to the load when the output voltage on the output terminal of the amplification component increases and to decrease the steered current when the output voltage on the output terminal of the amplification component decreases.

Another aspect of the embodiments disclosed herein is a steered current source for a class-A single-ended amplifier. The amplifier includes an amplification component that produces a time-varying amplified output voltage on an output terminal in response to an input signal on a control terminal. The output terminal of the amplification component is AC-coupled to a load. The steered current source comprises an input section coupled to the output terminal of the amplification component. The input section receives the output voltage produced by the amplification component and produces a control signal responsive to the output voltage. An output section of the steered current source generates a steered current responsive to the control signal produced by the input section. The steered current is provided to the output terminal of the amplification component. The steered current increases in response to the output voltage increasing. The steered current decreases in response to the output voltage decreasing.

In certain embodiments according to this aspect, the input section produces a first current proportional to the output voltage of the amplification component. The control signal is an input section voltage proportional to the first current. The steered current is proportional to the input section voltage such that the steered current provided to the output terminal of the amplification component is proportional to the output voltage of the amplification component.

In certain embodiments in accordance with this aspect, the input section of the steered current source comprises a first transistor having a control input terminal, a first controlled terminal and a second controlled terminal. The control input terminal is coupled to the output terminal of the amplification component. The first controlled terminal is coupled to a first resistor to produce a first voltage across the first resistor proportional to the output voltage on the output terminal of the amplification component and to produce a first current through the first resistor proportional to the first voltage. The first current flows between the first and second controlled terminals of the first transistor. A second resistor is coupled to the second controlled terminal of the first transistor to receive the first current. The second resistor produces the input section voltage proportional to the first current. The output section of the steered current source comprises a second transistor having a control input terminal, a first controlled terminal and a second controlled terminal. The control input terminal of the second transistor is coupled to receive the input section voltage. The first controlled terminal of the second transistor is coupled to a third resistor to reproduce the input section voltage across the third resistor. The third resistor produces the steered current proportional to the input section voltage. The steered current propagates through the second transistor from the first controlled terminal to the second controlled terminal and to the output terminal of the amplification component. In certain embodiments, the first transistor comprises at least one n-channel enhancement mode metal oxide semiconductor field effect transistor (MOSFET), and the second transistor comprises at least one p-channel enhancement mode MOSFET.

In certain embodiments in accordance with this aspect, the amplification component comprises a vacuum tube having at least a cathode, an anode and a grid. The output terminal of the amplification component is the anode of the vacuum tube.

Another aspect of the embodiments disclosed herein is a method for increasing the power provided to an AC-coupled load from a class-A single-ended amplifier having an amplification component responsive to an input signal to produce a time-varying amplified output voltage on an output terminal connected to the load. The method comprises coupling the output voltage from the output terminal of the amplification component to the input of a steered current source. The method further comprises generating a steered current within the steered current source. The steered current is proportional to the output voltage from the output terminal of the amplification component. The method further comprises coupling the steered current to the output terminal of the amplification component to provide at least a portion of the steered current to the load.

In certain embodiments in accordance with this aspect, the amplification component has an amplifier current that flows from the output terminal through the amplification component to a reference voltage. The method further comprises increasing the steered current from the steered current source and decreasing the amplifier current when the output voltage increases. The method further comprises decreasing the steered current from the steered current source and increasing the amplifier current when the output voltage decreases.

In certain embodiments in accordance with this aspect, the output voltage of the amplification component has an idle voltage magnitude; and the amplifier current has an idle current magnitude when the output voltage of the amplification component is at the idle voltage magnitude. The magnitude of the amplifier current decreases below the idle current magnitude when the magnitude of the output voltage increases above the idle voltage magnitude. The magnitude of the amplifier current increases above the idle current magnitude when the magnitude of the output voltage decreases below the idle voltage magnitude.

Another aspect of the embodiments disclosed herein is an amplification component having at least an output terminal, a reference terminal and a control terminal. The control terminal receives a time-varying input signal. The amplification component is responsive to the time-varying input signal to vary an output voltage on the output terminal and to vary a current flowing between the output terminal and the reference terminal. A load is AC-coupled to the output terminal of the amplification component. A steered current source has a voltage input coupled to the output terminal of the amplification component and has a steered current output coupled to the output terminal of the amplification component. The steered current source is configured to increase the steered current to provide current to the load when the output voltage on the output terminal of the amplification component increases and to decrease the steered current output when the output voltage on the output terminal of the amplification component decreases.

In certain embodiments in accordance with this aspect, the amplification component is a vacuum tube, the control terminal is a grid terminal, the output terminal is an anode terminal, and the reference terminal is a cathode terminal.

In certain embodiments in accordance with this aspect, the load is the primary winding of an output transformer, the output transformer having a secondary winding coupled to an audio transducer.

In certain embodiments in accordance with this aspect, the DC current flowing through the amplification component increases with increasing DC voltage on the output terminal, and the AC current flowing through the amplification current decreases with increasing AC voltage on the output terminal.

BRIEF DESCRIPTIONS OF THE SEVERAL VIEWS OF THE DRAWINGS

FIG. 4 illustrates an improved single-ended Class-A amplifier topology having a triode vacuum tube with a plate terminal connected to a voltage source via a steered current source and having the primary winding of an output transformer AC-coupled to the plate terminal.

FIG. 9 illustrates a table of the data represented by the DC load line of FIG. 8 under the no-load condition represented in FIG. 7.

FIG. 14 illustrates a table of the data represented by the AC load line of FIG. 13 with the 2,000-ohm load connection as shown in FIG. 10.

FIG. 18 illustrates a table of the data represented by the AC load line of FIG. 17 with the 4,000-ohm load.

DETAILED DESCRIPTION

Figure 1:
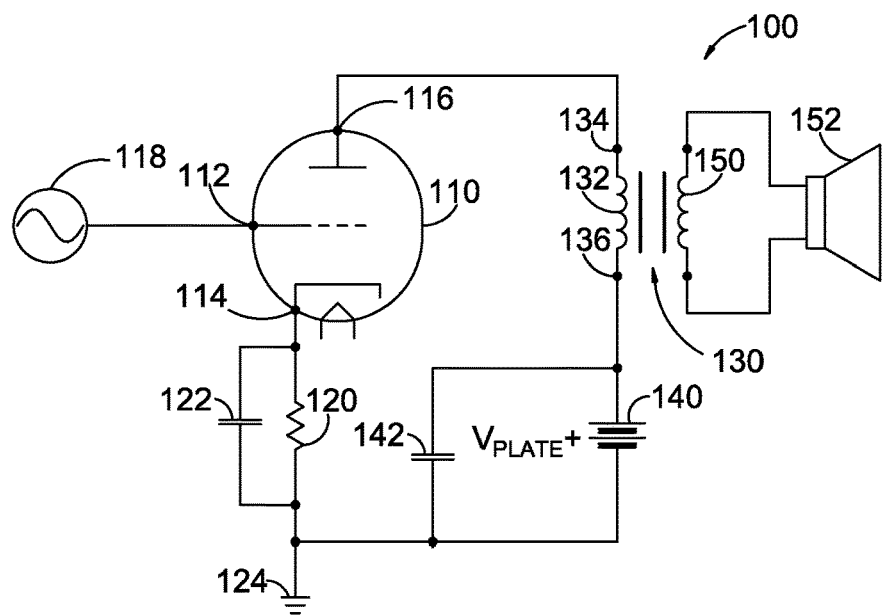
FIG. 1 illustrates a conventional single-ended Class-A amplifier topology having a triode vacuum tube with an anode (plate) terminal connected to a voltage source via the primary winding of an output transformer.

Reference will now be made in detail to embodiments of the present disclosure, one or more drawings of which are set forth herein. Each drawing is provided by way of explanation of the present disclosure and is not a limitation. It will be apparent to those skilled in the art that various modifications and variations can be made to the teachings of the present disclosure without departing from the scope of the disclosure. For instance, features illustrated or described as part of one embodiment can be used with another embodiment to yield a still further embodiment.

It is intended that the present disclosure covers such modifications and variations as come within the scope of the appended claims and their equivalents. Other objects, features, and aspects of the present disclosure are disclosed in the following detailed description. It is to be understood by one of ordinary skill in the art that the present discussion is a description of exemplary embodiments only and is not intended as limiting the broader aspects of the present disclosure.

FIG. 4 illustrates a Class A amplifier circuit 400 that implements a steered current source (SCS) topology in accordance with aspects of the invention disclosed herein. The circuit comprises a triode vacuum tube 410, which has a grid terminal 412, a first cathode/filament terminal 414, a second cathode/filament terminal 416 and a plate terminal 418. In the illustrated embodiment, the vacuum tube is a 300B, which is commercially available from Western Electric of Rossville, Ga., and from other manufacturers. The circuitry described herein is adaptable for use with other vacuum tubes and with field effect transistors (FETs) or the like. Certain component values discussed in the following paragraphs may be applicable only to embodiments employing the 300B vacuum tube and can be adjusted, if necessary, to conform to the operating characteristics of a component (e.g., another vacuum tube) substituted for the 300B vacuum tube.

In the illustrated embodiment, the cathode of the 300B vacuum tube is directly heated (e.g., the filament and the cathode are the same structure). Accordingly, the first and second cathode/filament terminals 414, 416 are connected to a floating filament power supply 420, which may be an AC filament supply or a DC filament supply. For example, the filament voltage may be approximately 5 volts. One of the first and second cathode/filament terminals (e.g., the second terminal) is connected to a circuit ground reference 422 such that the cathode/filament of the vacuum tube is effectively grounded at a ground reference voltage (e.g., 0 volts).

Figure 6:
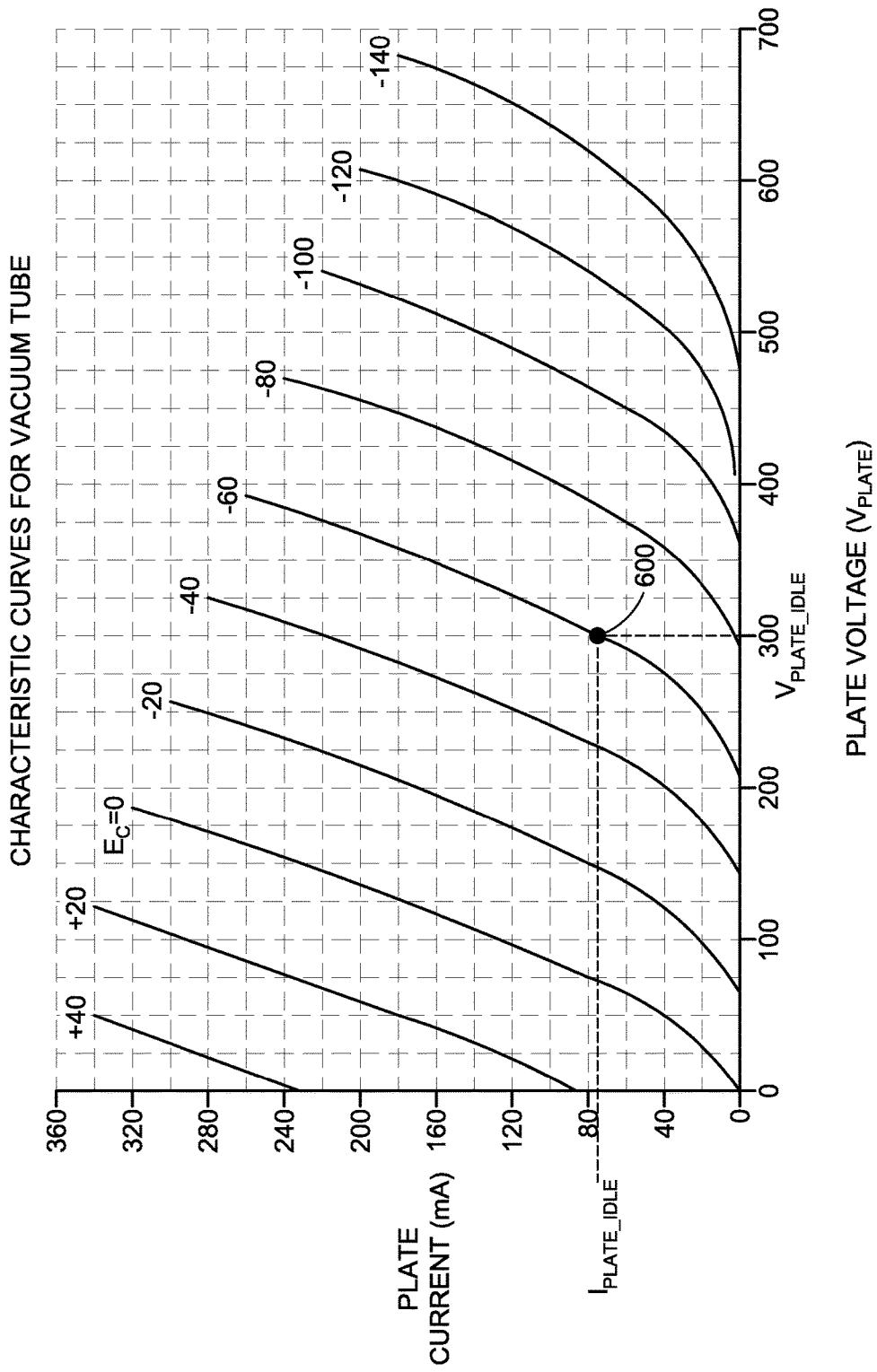
FIG. 6 illustrates graphs of characteristic curves for the DC relationship between the plate current versus the plate voltage for a typical triode vacuum tube for the single-ended Class-A amplifier topology of FIG. 4 wherein each curve represents the DC relationship for a particular grid voltage with respect to the cathode voltage.

The grid terminal 412 of the vacuum tube 410 is connected to a signal input line 424, which receives an AC input signal to be amplified by the vacuum tube. In certain embodiments, the signal input line is connected to the output of a preamplifier or another signal source (not shown). In the illustrated embodiment, the input signal to be amplified is DC biased at approximately −60 volts with respect to the cathode voltage (e.g., the ground reference voltage). The vacuum tube has a plate voltage ($V_{PLATE}$) at the plate terminal. A plate current ($I_{PLATE}$) flows from the plate terminal to the grounded cathode terminal 416. The DC bias of −60 volts causes the vacuum tube to produce an idle plate voltage ($V_{PLATE\_IDLE}$) of approximately 300 volts and to have an idle plate current ($I_{PLATE\_IDLE}$) of approximately 75 milliamperes as shown by an idle point 600 on a set of characteristic curves shown in FIG. 6. Each curve in FIG. 6 represents the plate current versus the plate voltage for a particular grid-to-cathode voltage ($E_C$). Circuits for biasing the grid terminal to a desired bias voltage are known in the art and are not shown in FIG. 4. In operation, the input signal is caused to vary as an AC signal about the bias voltage.

The plate terminal 418 of the vacuum tube 410 in FIG. 4 is connected to a current summing node 430. The current summing node is connected via an AC-coupling capacitor 432 to a first terminal 444 of a primary winding 442 of a power output transformer 440. A second terminal of 446 the primary winding is connected to the circuit ground reference 422. The power output transformer has a secondary winding 450, which is connected to an audio transducer (e.g., a loudspeaker) 452 or other load. In the illustrated embodiment, the turns ratio of the primary winding to the secondary winding is selected to be 500:1 such that when the loudspeaker has an impedance of 4 ohms, the impedance reflected into the primary impedance is 2,000 ohms. Other turns ratios and other impedance values may be used in other embodiments. As discussed below, when an AC input signal is applied to the grid terminal 412 of the vacuum tube, an AC load current ($I_{LOAD}$) flows through the AC-coupling capacitor to the primary winding of the power output transformer.

The plate terminal 418 of the vacuum tube 410 is also connected via the current summing node 430 to an input terminal 462 and an output terminal 464 of a steered current source (SCS) 460. The SCS comprises an input section 470 coupled to the input terminal and comprises an output section 472 coupled to the output terminal. As described below, the SCS is responsive to the plate voltage on the input terminal to provide a selected steered current $I_{SCS}$ on the output terminal. The steered current is controlled to reduce the plate current during portions of each cycle of the amplified AC signal such that the vacuum tube can operate over a much greater voltage range and provide greater peak power without exceeding the maximum average power dissipation of the vacuum tube. Although the input terminal and the output terminal of the SCS are both electrically connected to the plate terminal of the vacuum tube via the current summing node and are thus electrically at the same voltage potential, the two terminals are described as independent terminals based on their respective functionalities. The input terminal of the SCS receives a variable voltage input but draws substantially no current. The output terminal of the SCS provides a variable output current in response to the voltage on the input terminal; however, the output of the SCS does not affect the plate voltage. Accordingly, the voltage on the current summing node is determined solely by the plate voltage of the vacuum tube. As described below, the SCS operates in a servo mode wherein the input voltage on the input terminal (e.g., the plate voltage) is the driving input function to the servo and the steered current exiting from the output terminal is the driven output function from the servo.

The input section 470 of the SCS 460 comprises a first field effect transistor (FET) 480 having a control (e.g., gate) terminal 482, a source terminal 484 and a drain terminal 486. In the illustrated embodiment, the first FET is an n-channel enhancement mode FET such as, for example, a BSP300, which is commercially available from Infineon Technologies AG of Munich, Germany. The first FET conducts current from the drain terminal to the source terminal when a voltage on the gate terminal of the first FET is greater than the voltage on the source terminal.

The source terminal 484 of the first FET 480 is connected to the circuit ground reference 422 via a source resistor 490 and an SCS ground terminal 492. In the illustrated embodiment, the source resistor has a nominal resistance of approximately 300,000 ohms. The drain terminal 486 of the first FET is connected to a control node 500, which connects the input section 470 of the SCS 460 to the output section 472 of the SCS. Within the input section, the control node is connected to a plate supply voltage ($V_{CC}$) bus 510 via a current sensing resistor 512. In the illustrated embodiment, the current sensing resistor has a nominal resistance of approximately 3,000 ohms. As described below, a voltage $V_{NODE}$ on the control node functions as a control signal to control the operation of the output section of the SCS.

The control node 500 of the SCS 460 is also connected to a control (e.g., gate) terminal 522 of second FET 520 within the output section 472 of the SCS. The second FET has a source terminal 524 and a drain terminal 526. The source terminal of the second FET is connected to the $V_{CC}$ bus 510 via a current control resistor 530. In the illustrated embodiment, the current control resistor has a nominal resistance of approximately 40 ohms. The drain of the second FET is connect to the output terminal 464 of the SCS and is thus connected to the plate terminal 418 of the vacuum tube 410 via the current summing node 430. In the illustrated embodiment, the second FET is a p-channel enhancement mode FET in which current flows from the source terminal to the drain terminal of the FET when a voltage on the gate terminal is lower than a voltage on the source terminal. The second FET operates as a variable resistance in series with resistance of the current control resistor. Together, the two resistances have a total resistance $R_{SCS}$. A voltage drop $V_{SCS}$ develops across the total resistance. The voltage drop $V_{SCS}$ is the product of the current $I_{SCS}$ flowing from the $V_{CC}$ bus to the output terminal of the SCS times the resistance $R_{SCS}$.

The SCS 460 operates to control the current from the output terminal 464 of the SCS in response to the plate voltage applied to the input terminal 462 of the SCS via the current summing node 430. The SCS is driven solely by the plate voltage $V_{PLATE}$ on the plate terminal 418 of the vacuum tube 410. As described below, the SCS selectively reduces the plate current flowing from the plate terminal to the cathode terminals 414, 416; however, the SCS does not affect the plate voltage and thus does not introduce distortion to the amplified voltage on the plate terminal. As described above, the first FET 480, the source resistor 490 and the current sensing resistor 512 comprise the input section 470 of the SCS, which is driven by the plate voltage on the input terminal. The input section of the SCS determines the control voltage $V_{NODE}$ on the control node 500. The second FET 520 and the current control resistor 530 comprise the output section 472 of the SCS and generate a steered current in response to the signal on the control node. The steered current is provided to the plate terminal via the current summing node without affecting the plate voltage. Accordingly, the SCS operates as a servomechanism to control the steered current in response to the plate voltage.

Figure 7:
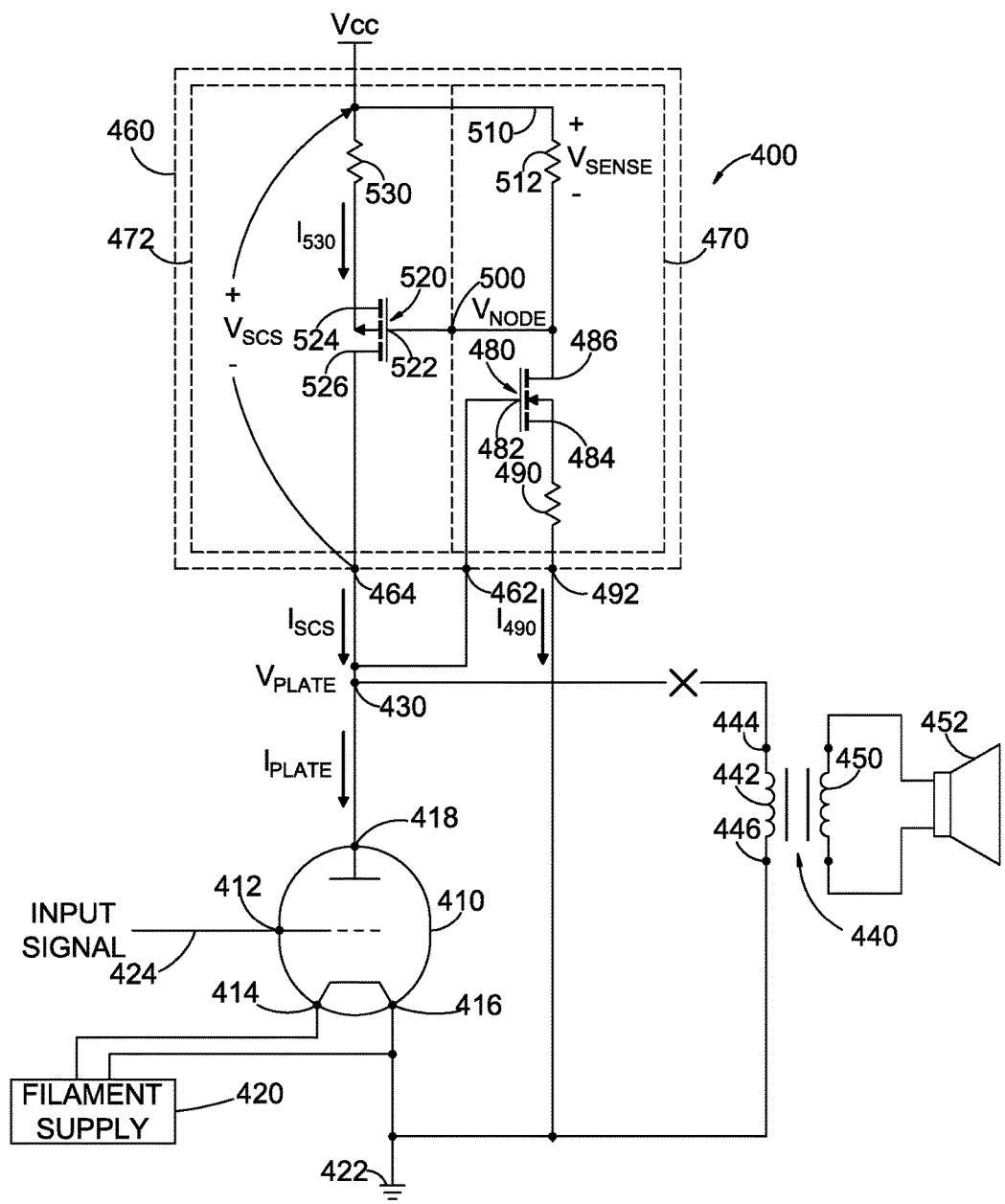
FIG. 7 illustrates the improved single-ended Class-A amplifier topology of FIG. 4 wherein the AC-coupling from the plate terminal to the primary winding of the output transformer is disconnected such that no current flows into or out of the primary winding.

The operation of the SCS 460 is first described under a no-load condition such that no current flows from the current summing node 430 through the AC-coupling capacitor 432 to the power output transformer 440. The no-load condition can be represented by removing the AC-coupling capacitor 432 between the current summing node and the first terminal 444 of the primary winding 442 of the power output transformer as shown in FIG. 7. When no load is present, the plate current is determined by the SCS as shown on a first load line 800 in FIG. 8. The first load line is shown superimposed on the characteristic curves of FIG. 6. As discussed above, when the vacuum tube 410 is in the idle state, the grid voltage on the grid terminal 412 of the vacuum tube is approximately −60 volts with respect to the grounded cathode terminals 414, 416. This grid voltage causes the plate voltage $V_{PLATE}$ to be approximately 300 volts. The SCS is responsive to the plate voltage of 300 volts to force the plate current $I_{PLATE}$ to be approximately 75 milliamperes. The plate voltage is applied to the gate terminal 482 of the first FET 480 in the SCS. The gate of the first FET has a very high impedance. Thus, substantially no current flows into the gate terminal of the first FET. The gate-to-source voltage is presumed to be approximately 0 volts when the first FET is turned on such that the voltage developed on the source terminal 484 of the first FET is approximately the same as the plate voltage. Thus, the voltage $V_{PLATE}$ develops across the source resistor 490 with respect to the circuit ground reference 422. A source current 1490 flows through the source resistor that is determined by the resistance of the source resistor. In the illustrated embodiment, the resistance of the source resistor is approximately 300,000 ohms, which results in a source current of approximately $V_{PLATE}/300{,}000$ amperes. Accordingly, in the idle state, the source current is approximately 1 milliampere (e.g., 300 volts/300,000 amperes).

The source current $I_{R490}$ flowing through the source resistor 490 also must flow through the control sensing resistor 512. Thus, in this example, 1 milliampere of current flows through the control sensing resistor. The current flowing through the current sensing resistor causes a voltage drop $V_{SENSE}$ across the current sensing resistor. The voltage $V_{SENSE}$ is approximately equal to the source current $I_{490}$ times the resistance $R_{512}$ of the current sensing resistor. In the illustrated embodiment where $R_{512}$ is approximately 3,000 ohms, the voltage $V_{SENSE}$ is approximately equal to the source current 1490 times 3,000 ohms, which calculates to $V_{SENSE}$ being approximately equal to 3 volts. The foregoing calculations can be reduced to $V_{SENSE}=V_{PLATE}/100$.

A voltage $V_{NODE}$ on the control node 500 is approximately equal to $V_{CC}-V_{SENSE}$. The voltage $V_{NODE}$ is applied to the gate terminal 522 of the second FET 520 to cause the gate terminal of the second FET to be at a voltage level less than the voltage of the $V_{CC}$ bus 510. The $V_{CC}$ bus is connected to the source terminal 524 of the second FET via the current control resistor 530. Thus, the lower gate voltage causes the second FET to turn on and to conduct current from the source terminal to the drain terminal 526 of the second FET. The source-to-gate voltage of the second FET is presumed to be approximately 0 volts for the purposes of this discussion. Thus, the voltage on the source terminal of the second FET is approximately equal to $V_{NODE}$. The voltage developed across the current control resistor is approximately $V_{CC}-V_{NODE}$, which corresponds to $V_{CC}-(V_{CC}-V_{SENSE})$, which reduces to $V_{SENSE}$. Thus, the sensed voltage across the current sensing resistor 512 is applied across the current control resistor.

A current 1530 through the current control resistor 530 is approximately equal to the voltage across the current control resistor (e.g., $V_{SENSE}$) divided by the resistance $R_{530}$ of the current control resistor (e.g., $1530=V_{SENSE}/R_{530}$). Thus, in the illustrated example where $R_{530}$ is approximately 40 ohms, the current 1530 is approximately equal to $V_{SENSE}/40$. As described above, $V_{SENSE}$ is approximately equal to $V_{PLATE}/100$ (3 volts in the illustrated example). Thus, the current $I_{530}$ through the current control resistor is substantially equal to $(V_{RATE}/100)/R_{530}$. In the illustrated embodiment where $R_{530}$ is approximately 40 ohms, the current 1530 is approximately $V_{PLATE}/4000$, which, in the illustrated example, is approximately 75 milliamperes. The current 1530 through the current control resistor passes through the second FET 520 to the output terminal 464 of the SCS 460 as the steered current $I_{SCS}$. The steered current is thus provided to the current summing node 430.

Figure 5:
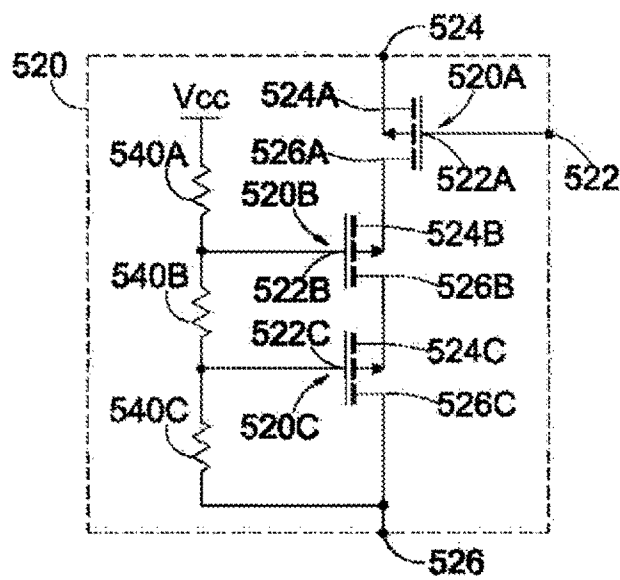
FIG. 5 illustrates a schematic diagram of the p-channel metal oxide semiconductor field effect transistor (MOSFET) in the steered current source of FIG. 4 implemented as three p-channel MOSFETs connected in series.

The second FET 520 illustrated in FIG. 4 is a p-channel FET able to accommodate a source-to-drain voltage of at least 600 volts. Although illustrated as a single p-channel FET, the second FET may comprise a plurality of p-channel FETS (e.g., three FETS) connected in series to accommodate the maximum voltage developed across the second FET. For example, FIG. 5 illustrates the second FET as three p-channel FETs connected in series. A first series FET 520A has a gate terminal 522A corresponding to the gate terminal 522 of the second FET, which is connected to the control node 500 as shown in FIG. 4. The source terminal 524A of the first series FET corresponds to the source terminal 524 of the second FET, which is connected to the current control resistor as shown in FIG. 4. The drain terminal 526A of the first series FET is connected to the source terminal 524B of a second series FET 520B. The drain terminal 526B of the second series FET is connected to the source terminal 524C of a third series FET 520C. The drain terminal 526C of the third series FET corresponds to the drain terminal 526 of the second FET, which is connected to the SCS output terminal 464 as shown in FIG. 4. The gate terminal 522B of the second series FET is connected to the $V_{CC}$ bus 510 via a first gate-biasing resistor 540A. The gate terminal 522C of the third series FET is connected to the gate terminal of the second series FET by a second gate-biasing resistor 540B. The gate terminal of the second series FET is also connected to a first terminal of a third gate-biasing resistor 540C. The second terminal of the third gate-biasing resistor corresponds to the drain terminal of the second FET, which is connected to the SCS output terminal as shown in FIG. 4. In the illustrated embodiment, the three gate-biasing resistors are 100,000-ohm resistors and operate to turn on the second and third series FETs. In the illustrated embodiment, each of the first, second and third series FETs comprises an IRFI9634G p-channel FET, which is commercially available from International Rectifier of El Segundo, Calif. Each FET is rated with a source-to-drain voltage of 250 volts such that the three FETs in series are able to accommodate at least 750 volts, which is more than the 600 volts maximum applied across the FETs as described below. The first series FET controls the voltage applied across the current control resistor as described above. The three FETs can be replaced with a single FET having a source-to-drain voltage rating of at least 600 volts The foregoing calculations are illustrated by the load line 800 in FIG. 8. In particular, the load line starts with 0 milliampere of current flow when the plate voltage is at 0 volts and rises to 150 milliamperes of current flow when the plate voltage is at 600 volts. Thus, the load line 800 represents the equivalent of the combination of the SCS 460 and the vacuum tube 410 having a positive resistance of 4,000 ohms. The load line 800 can also be said to represent a voltage-to-current relationship of 0.25 milliamperes of plate current per 1 volt of plate voltage. The data represented by the load line are shown in a Table 900 in FIG. 9.

Figure 10:
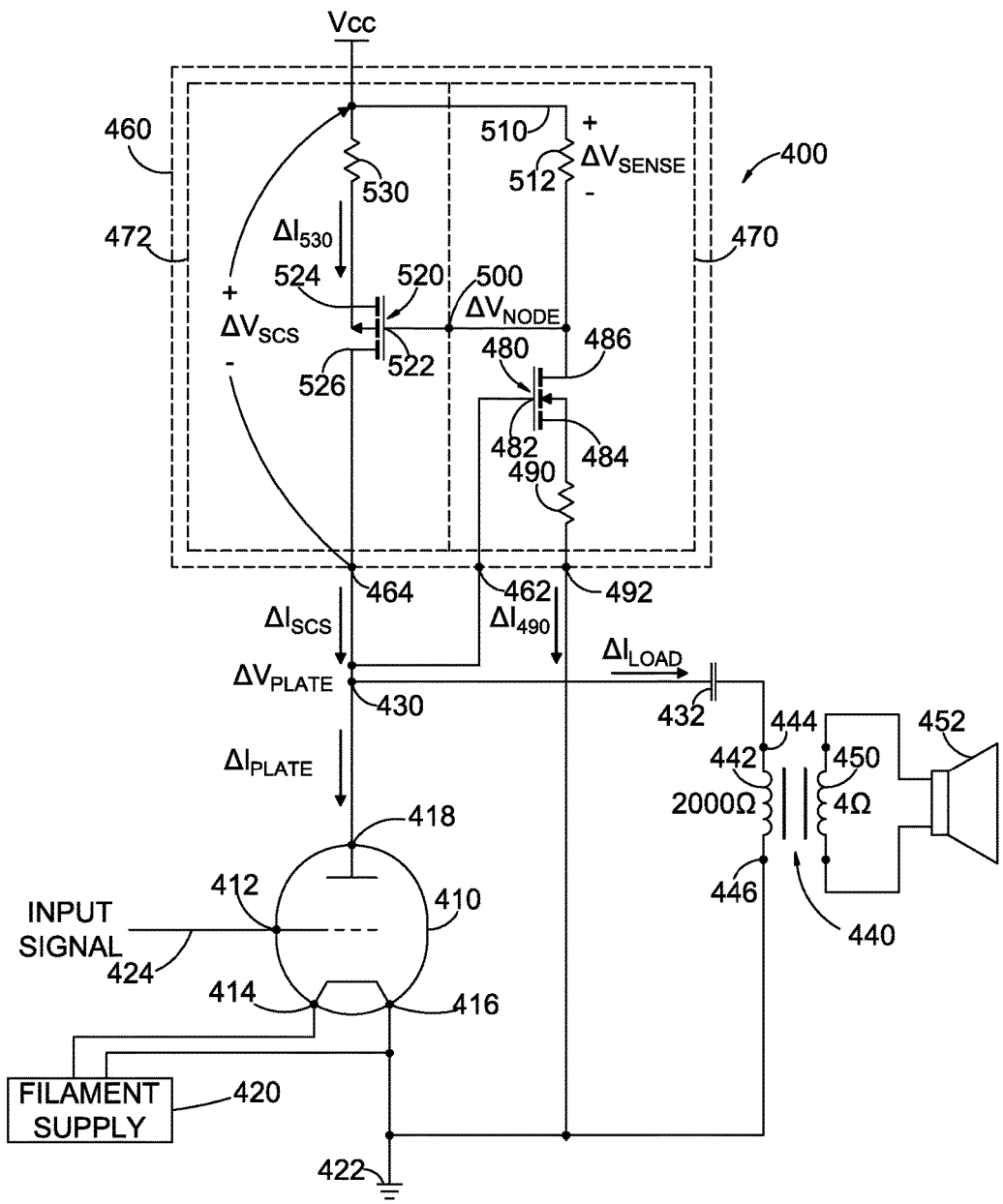
FIG. 10 illustrates the improved single-ended Class-A amplifier topology of FIG. 4 with a 2,000-ohm load impedance AC-coupled to the plate terminal of the vacuum tube, the topology annotated with current and voltage changes responsive to voltage changes on the plate terminal of the vacuum tube.

The benefits of the steered current source 460 become apparent when an AC load is coupled to the plate terminal 416 of the vacuum tube 410 by coupling the loudspeaker 452 to the plate terminal via the power output transformer 440 and the AC-coupling capacitor 432. A first example of an AC load condition is represented in FIG. 10 for a loudspeaker having an impedance of 4 ohms. The loudspeaker impedance is reflected into the primary winding 442 of the power output transformer as an impedance of 2,000 ohms. In the frequency range of interest, the reflected impedance is considered as a resistive load of 2,000 ohms, and the AC-coupling capacitor is presumed to be a short circuit for the AC component of plate voltage. The capacitance of the capacitor is selected such that the capacitor does not become substantially charged at the audio frequencies applied to the signal input line 424. Thus, each change in the plate voltage is propagated to the primary winding of the power output transformer such that the current flowing through the primary winding is directly responsive to the change in plate voltage.

Figure 8:
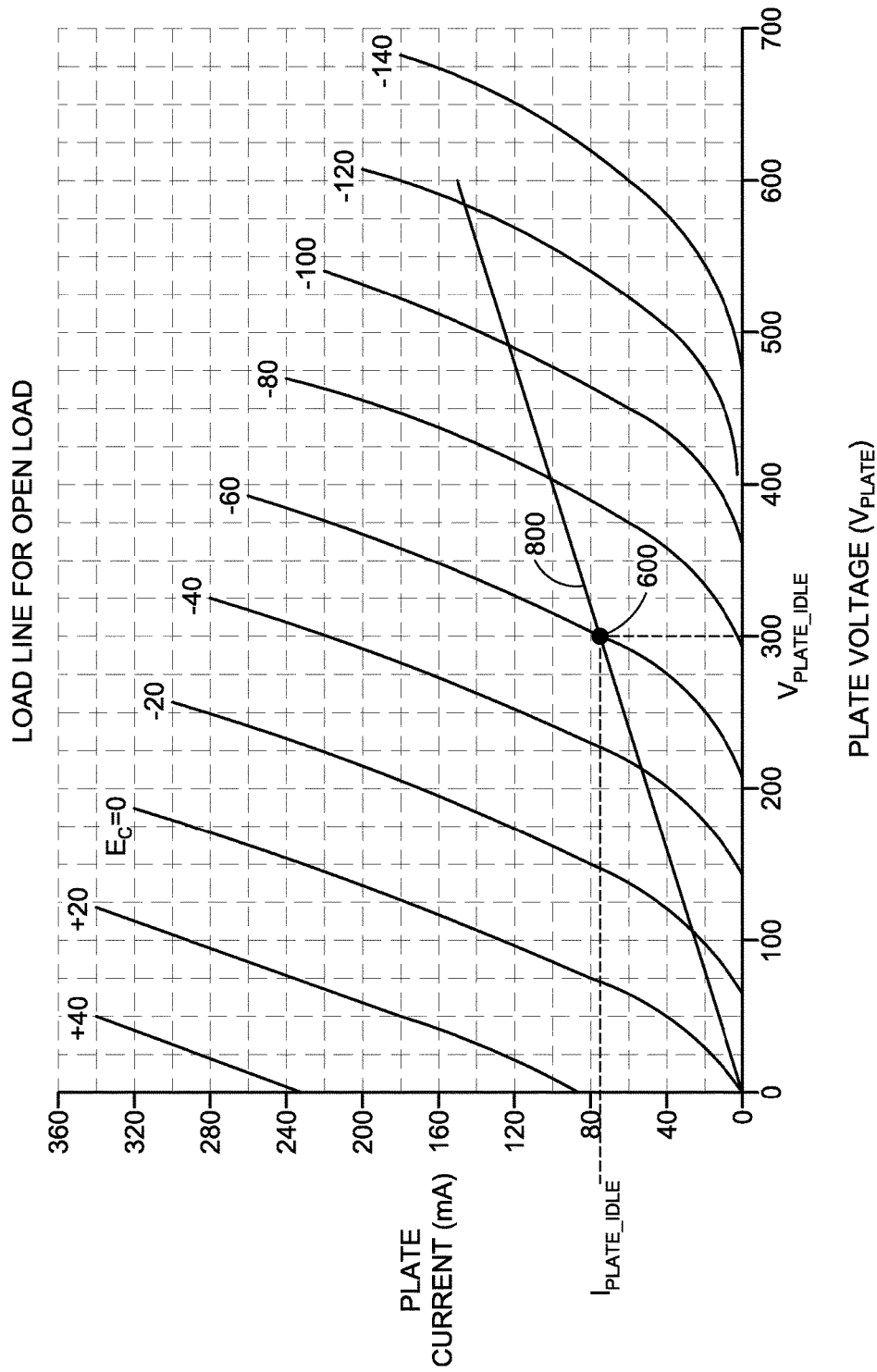
FIG. 8 illustrates a DC load line superimposed on the characteristic curves of FIG. 6 to illustrate the DC relationship between the plate current and the plate voltage of the improved single-ended Class-A amplifier topology with no load connection (e.g., infinite load impedance) as shown in FIG. 7.

If the plate voltage is initially at the idle voltage (e.g., $V_{PLATE}=V_{IDLE}$), the voltages and currents within the components of the SCS 460 have the initial (e.g., idle) values described above. In FIGS. 7-9, increasing the plate voltage increases the plate current and decreasing the plate voltage decreases the plate current to cause new steady-state conditions at each magnitude of plate voltage as expected for the DC analysis. As described below, the effect of the SCS under AC loading conditions is to decrease the plate current in response to increases in plate voltages and to increase the plate current in response to decreases in plate voltage.

In an illustrated example, the plate voltage $V_{PLATE}$ increases by 20 volts from $V_{IDLE}$ to $V_{IDLE}+20$ (e.g., $\Delta V_{PLATE}=+20$ volts). The incremental change in the plate voltage is communicated via the current summing node 430 and the AC-coupling capacitor 432 to cause 20 volts to develop across the primary winding 442 of the power output transformer from the first primary winding terminal 444 to the second primary winding terminal 446. This results in an initial change in load current ($\Delta I_{LOAD}$) of 10 milliamperes flowing from the plate terminal 416 through the AC-coupling capacitor to the primary winding. The 20-volt increase in plate voltage is also applied via the SCS input terminal 462 to the gate terminal 482 of the first FET 480, which causes the voltage on the source terminal 484 of the first FET to increase by 20 volts. The current through the source resistor 490 increases by ($\Delta V_{RATE}/300,000$) amperes. The increased current causes the sensed voltage across the 3,000-ohm current sensing resistor 512 to increase by $\Delta V_{RATE}/100$ (e.g., $\Delta V_{SENSE}=200$ millivolts). As discussed above, the voltage change across the current sensing resistor is applied across the current control resistor 530 via the control node 500 and the second FET 520. Thus, the voltage across the current control resistor also increases by 200 millivolts. The current $I_{R530}$ through the current control resistor increases by the voltage change across the current control resistor divided by 40 ohms (e.g., $\Delta I_{530}=5$ milliamperes). Thus, for the illustrated 20-volt increment in plate voltage, the steered current $I_{SCS}$ increases by 5 milliamperes (e.g., $\Delta I_{SCS}=5$ milliamperes)

Figure 11A:
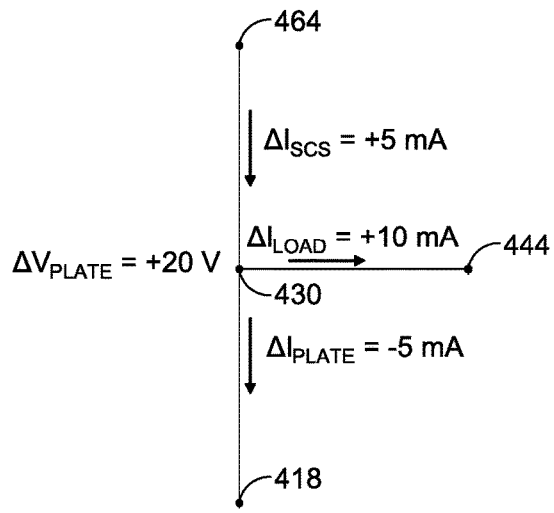
FIG. 11A illustrates the current summing at the plate terminal when the AC plate voltage increases by 20 volts, which results in the AC plate current decreasing by 5 milliamperes.
Figure 11B:
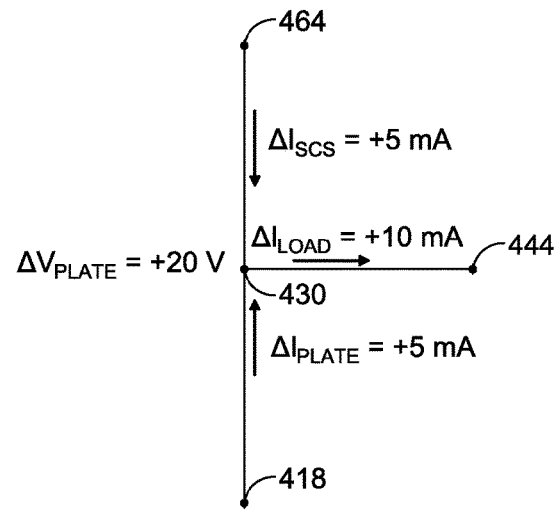
FIG. 11B illustrates the current summing at the plate terminal when the AC plate voltage increases by 20 volts as in FIG. 11A which results in the AC plate current decreasing by 5 milliamperes, the decrease in plate current in FIG. 11A shown as an increase in plate current in the opposite direction to better illustrate the current summing at the plate terminal.

The 5-milliampere increase in the steered current $I_{SCS}$ from the SCS 460 does not provide all the increase in current (10 milliamperes) required for the primary winding 442. In order to satisfy Kirchhoff's current summing law, the algebraic sum of all currents entering and exiting the current summing node 430 must equal zero. Since an increase of 10 milliamperes of current is exiting the current summing node via the AC-coupling capacitor 432 and an increase of only 5 milliamperes of current is entering the current summing node from the SCS, an additional increase of 5 milliamperes of current must enter the current summing node to achieve a zero sum. Accordingly, an increase of 5 milliamperes of current must flow from the plate terminal 418 of the vacuum tube 410 to the current summing node. Since the current can only flow into the plate terminal, the increase of 5 milliamperes of current flowing from the plate terminal to the node is actually a decrease of 5 milliamperes of plate current flowing from the current summing node to the plate terminal. The foregoing is illustrated in FIGS. 11A and 11B by two equivalent current flows at the current summing node. FIG. 11A shows the actual changes in the current flows wherein the change in the plate current in the actual direction of current flow is negative. FIG. 11B replaces the negative change of the current flow in the conventional direction with a positive change of the plate current flow in the opposite direction from the plate terminal toward the current summing node. Thus, the 5-milliampere increase in current from the SCS and the 5-milliampere decrease in the plate current (shown flowing toward the current summing node in FIG. 11B) provide the 10-milliampere increase in current provided to the primary winding (shown flowing away from the current summing node).

It should be understood that the foregoing description is an AC analysis directed to changes in the current caused by dynamic changes in the plate voltage. If the plate voltage changes from the idle voltage of 300 volts to a new steady-state voltage of 320 volts, the AC coupling capacitor would eventually become fully charged at the new voltage level and no current would flow through the primary winding 442 of the power output transformer 440. Under the new steady-state conditions, the plate current would increase by 5 milliamperes, and the steered current from the SCS 460 would increase by 5 milliamperes to provide the increased plate current as described above for the embodiment with no output load.

Figure 12A:
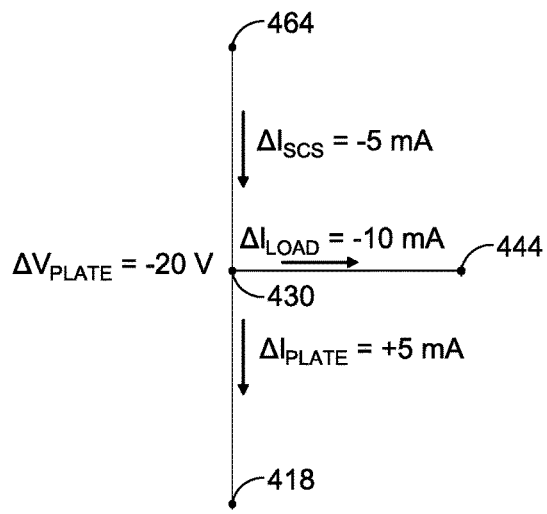
FIG. 12A illustrates the current summing at the plate terminal when the AC plate voltage decreases by 20 volts, which results in the AC plate current increasing by 5 milliamperes.
Figure 12B:
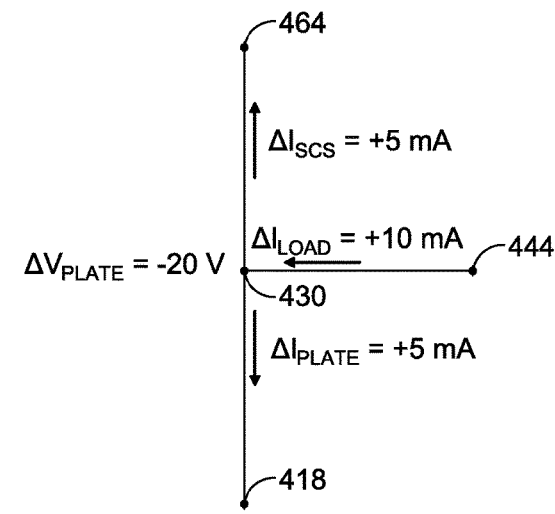
FIG. 12B illustrates the current summing at the plate terminal when the AC plate voltage decreases by 20 volts as in FIG. 12A which results in the AC plate current increasing by 5 milliamperes, the decrease in load current in FIG. 12A shown as an increase in load current in the opposite direction to better illustrate the current summing at the plate terminal.

The AC analysis described above, also works for a reduction in the plate voltage. For example, if the plate voltage decreases from the plate idle voltage ($V_{IDLE}$) of 300 volts to a plate voltage of 280 volts (e.g., $\Delta V_{PLATE}=-20$ volts). When this occurs, the decrease in the plate voltage appears across the primary winding 442 to cause the first terminal 444 of the primary winding to be at a potential of −20 volts with respect to the second terminal 446 of the primary winding. The negative change in the voltage across the primary winding causes a current of 10 milliamperes to flow from the primary winding through the AC coupling capacitor 432 to the current summing node 430. Within the SCS 460, the decrease of 20 volts on the gate terminal 482 of the first FET 480 appears across the source resistor 490 to cause a current change of −20 volts divided by 300,000 ohms to occur within the source resistor. The decrease in current flow through the source resistor causes a corresponding decrease in current flow through the current sensing resistor 512. The decrease in current flow through the current sensing resistor causes a reduction in the voltage across the current sensing resistor of (−20/300,000)×3,000) volts (e.g., −200 millivolts). The 200-millivolt decrease across the current sensing resistor is applied across the current control resistor 530 via the second FET 520. The corresponding 200-millivolt decrease across the current control resistor causes the steered current ($I_{SCS}=I_{530}$) provided to the output terminal 464 of the SCS 460 to decrease by 5 milliamperes (e.g., −200 mV/40 ohms). The decrease in the steered current flowing from the output terminal of the SCS to the current summing node in FIG. 12A is represented as a positive increase in current flow from the current summing node to the output terminal of the SCS in FIG. 12B.

Figure 13:
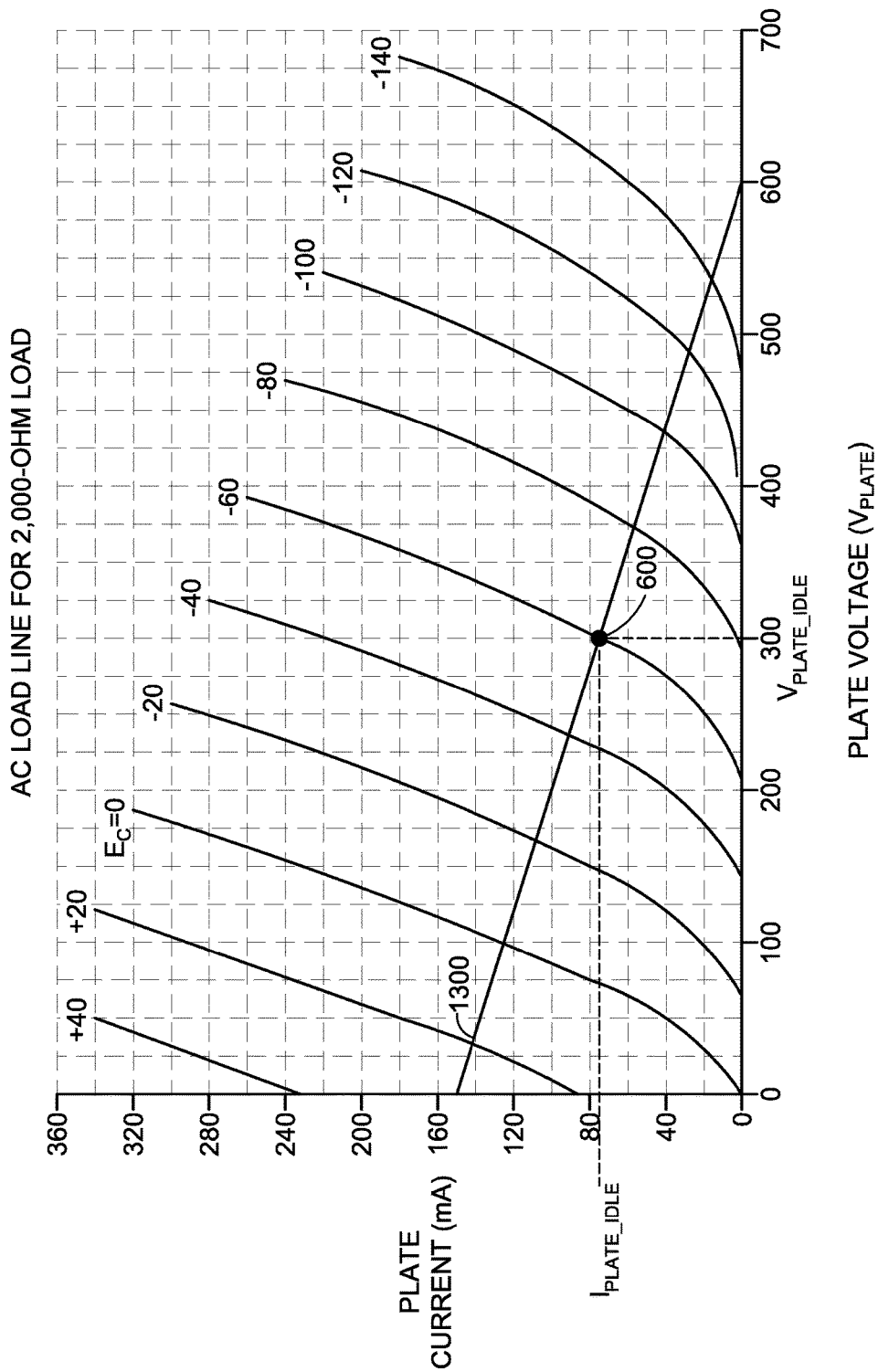
FIG. 13 illustrates an AC load line superimposed on the characteristic curves of FIG. 6 to illustrate the AC relationship between changes in the plate current caused by changes in the plate voltage and the resulting changes in the steered current of the improved single-ended Class-A amplifier topology of FIG. 4 with the 2,000-ohm load connection of FIG. 10.

The operation of the embodiment of FIG. 10 results in the AC load line 1300 shown in FIG. 13. The data corresponding to the load line of FIG. 13 are shown in FIG. 14. As illustrated in FIG. 13, the AC load line has a negative slope. The line extends from a plate voltage of 0 volts and a plate current of 150 milliamperes to a plate voltage of 600 volts and a plate current of 0 milliamperes.

The foregoing can also be explained mathematically. As shown by the table 900 in FIG. 9 for the open load DC characteristics, the plate current $I_{PLATE}$ is related to the plate voltage $V_{PLATE}$ by the following Equation (1):

$$I_{PLATE}=V_{PLATE} \times 0.00025 \text{ Amperes/Volt} \quad (1)$$

Since the plate current and the steered current ($I_{SCS}$) are equal in the open load representation of FIG. 7, Equation (2) can also be written as the following Equation (2):

$$I_{SCS}=V_{PLATE} \times 0.00025 \text{ Amperes/Volt} \quad (2)$$

Equations (1) and (2) result in the idle plate current ($I_{PLATE\_IDLE}$) and thus the steered current $I_{SCS}$ being 0.075 amperes at an idle plate voltage ($V_{PLATE\_IDLE}$) of 300 volts. Since the plate current and the steered current are both proportional to the plate voltage, Equation (2) can be rewritten as the following Equation (3):

$$I_{SCS}=V_{PLATE} \times (I_{PLATE\_IDLE}/V_{PLATE\_IDLE}) \quad (3)$$

For the foregoing AC analysis, the idle current and idle voltage are neglected. As discussed above, the effective resistance $R_{SCS}$ is the sum of the resistance of the current control resistor 530 in series with the effective source-to-gate resistance of the second FET 520. The steered current $I_{SCS}$ flowing through the two resistances develops the voltage drop $V_{SCS}$ between the $V_{CC}$ bus 510 and the output terminal 464 of the SCS 460. The resistance $R_{SCS}$ is related to the steered current and the voltage drop by the following Equation (4):

$$R_{SCS}=V_{SCS}/I_{SCS} \quad (3)$$

FIGS. 4, 7 and 10 show that $V_{SCS}$ is equal to $V_{CC}-V_{PLATE}$. Thus, the resistance can be determined by the following Equation (4):

$$R_{SCS}=(V_{CC}-V_{PLATE})/I_{SCS} \quad (4)$$

For AC considerations, $V_{CC}$ and ground are equivalent. Thus, $V_{CC}$ is equal to 0 volt for the AC analysis such that Equation (4) reduces to the following Equation (5):

$$R_{SCS}=-V_{PLATE}/I_{SCS} \quad (5)$$

Substituting Equation (3) for $I_{SCS}$ into Equation (5) results in the following Equation (6):

$$R_{SCS}=-V_{PLATE}/(V_{PLATE} \times (I_{PLATE\_IDLE}/V_{PLATE\_IDLE}))=-V_{PLATE\_IDLE}/I_{PLATE\_IDLE} \quad (6)$$

As set forth above, $V_{PLATE\_IDLE}$ is 300 volts and $I_{PLATE\_IDLE}$ is 75 milliamperes. Thus, $R_{SCS}$ is −4,000 ohms in the illustrated example. Accordingly, the effect of the SCS 460 is to position a negative resistance of 4,000 ohms between the current summing node 430 and the circuit ground reference 422 for AC voltages on the plate terminal. This effect is illustrated in FIGS. 15A, 15B, 16A and 16B, wherein the SCS is replaced with an SCS equivalent resistance 1500 having a negative resistance of $R_{SCS}$ between the current summing node and the circuit ground reference. The SCS equivalent resistor is positioned in parallel with an AC equivalent resistance 1510 having a resistance $R_{PRIM}$ (e.g., 2,000 ohms) representing the load impedance reflected into the primary winding 442 of the power output transformer 440. The vacuum tube 400 is represented by a voltage source 1520 in FIGS. 15A, 15B, 16A and 16B. The output of the voltage source corresponds to the plate terminal 418 of the vacuum tube. One skilled in the art will appreciate that the two resistances are effectively in parallel for the AC analysis. The negative resistance of the SCS equivalent resistance and the positive resistance of the winding equivalent resistance can be combined using the conventional formula for calculating parallel resistances to confirm the results described herein. The formula for parallel resistances can be written as follows:

$$R_{TOTAL}=1/[(1/R_{PRIM})+(1/R_{SCS})] \quad (7)$$

When $R_{SCS}$ is −4000 ohms and $R_{PRIM}$ is 2000 ohms as in the illustrated example, $R_{TOTAL}$ is calculated as $R_{TOTAL}=1/[(-1/4000)+(1/2000)]=1/(1/4000)=4000$ ohms. With a total effective AC load of 4000 ohms on the vacuum tube 410, the ±300-volt swing of the plate voltage can deliver twice the power to the 2,000-ohm AC load (e.g., the loudspeaker 452) while the dissipation of the vacuum tube is maintained within a safe power dissipation region.

Figure 15A:
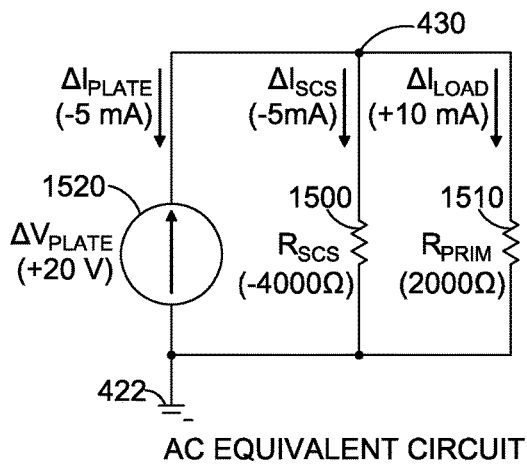
FIG. 15A illustrates an AC equivalent circuit representing the vacuum tube as a voltage source and representing the steered current source as an equivalent negative resistance resistor in parallel with the load resistance showing the current changes corresponding to the changes of FIG. 11A in response to an increase in plate voltage.
Figure 15B:
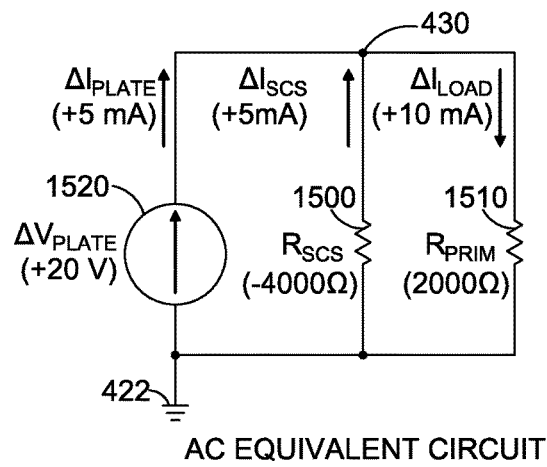
FIG. 15B illustrates the AC equivalent circuit of FIG. 15A showing the negative plate current change and steered current change away from the plate terminal in FIG. 15A as positive current changes toward the plate terminal.

As shown in FIG. 15A, when the voltage on the current summing node 430 produced by the voltage source 1520 increases by 20 volts with respect to the circuit ground reference 422, the increased voltage causes an increased load current $\Delta I_{LOAD}$ through the AC equivalent resistance 1510 of the primary winding. In the illustrated example, the load resistance of 2,000 ohms allows 10 milliamperes of current to flow toward the circuit ground reference 422. The increased voltage also causes an increased current $\Delta I_{SCS}$ through the SCS equivalent resistance 1500; however, the SCS equivalent resistance has a negative resistance (e.g., −4,000 ohms in the illustrated example). Thus, a negative current of 5 milliamperes flows in the direction towards the circuit ground reference. Accordingly, to balance the currents, a negative current of 5 milliamperes must also flow from the voltage source to the circuit ground reference as shown. The foregoing can also be understood as before by substituting positive currents in opposite directions for the two negative currents as shown in FIG. 15B. As shown in FIG. 15B, the reduction in current provided by the voltage source (e.g., the vacuum tube) at the current summing node and the increase in the SCS current provided to the current summing node flow into the current summing node to compensate for the increased load current $\Delta I_{LOAD}$ through the AC equivalent resistance of the primary winding, which flows out of the current summing node.

Figure 16A:
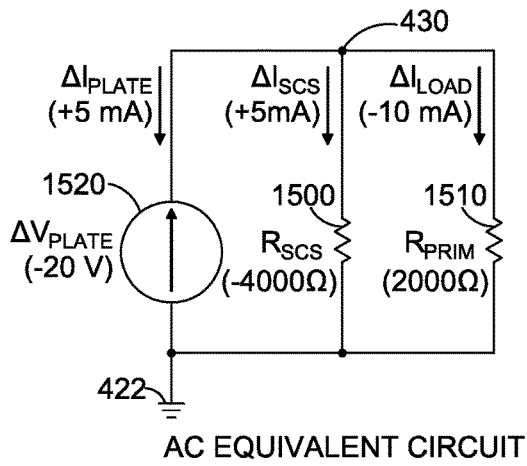
FIG. 16A illustrates the AC equivalent circuit of FIG. 15A showing the current changes corresponding to the changes of FIG. 12A in response to a decrease in plate voltage.
Figure 16B:
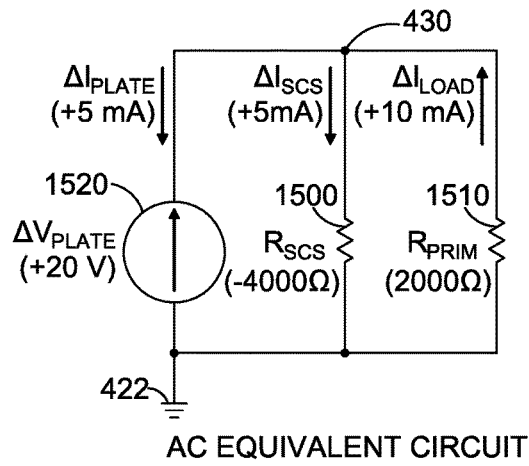
FIG. 16B illustrates the AC equivalent circuit of FIG. 15A showing the negative load current change away from the plate terminal in FIG. 16A as a positive load current change toward the plate terminal.

In FIG. 16A, a decrease in the plate voltage $\Delta V_{PLATE}$ at the current summing node 430, results in a decrease in the load current $\Delta I_{LOAD}$ through the AC equivalent resistance 1510 of the primary winding. The decrease in the load current is represented by a negative value of 10 milliamperes in the conventional current flow direction from the current summing node toward the circuit ground reference 422. The decrease in the plate voltage applied across the negative resistance of the SCS equivalent resistance 1500 causes the current to increase in the direction from the current summing node toward the circuit ground reference by 5 milliamperes in the illustrated example. To balance the currents, the current through the voltage source 1520 in the direction from the current summing node toward the circuit ground reference must also increase by 5 milliamperes. FIG. 16B illustrates the same result with the decreased load current illustrated as a positive current directed toward the current summing node.

Figure 17:
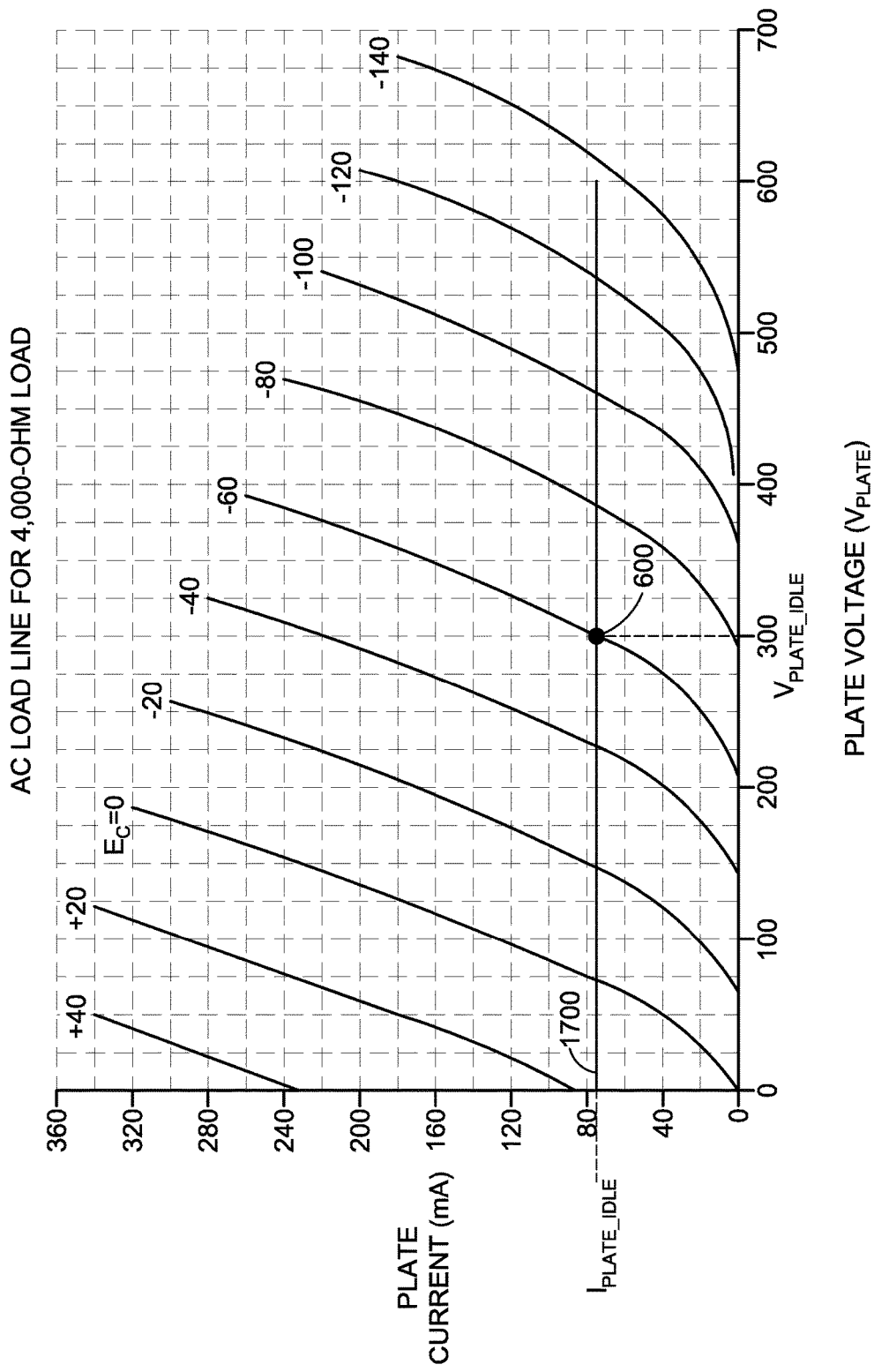
FIG. 17 illustrates an AC load line superimposed on the characteristic curves of FIG. 6 to illustrate the AC relationship between changes in the plate current caused by changes in the plate voltage and the resulting changes in the steered current of the improved single-ended Class-A amplifier topology of FIG. 4 with a 4,000-ohm load replacing the 2,000-ohm load of FIG. 10.

The SCS 460 can also be used with other load resistances representing the primary winding. For example, if the characteristic impedance of the loudspeaker 452 is increased to 8 ohms, the impedance reflected into the primary 442 of the power output transformer 440 is 4,000 ohms rather than 2,000 ohms. With $R_{LOAD}$ equal to 4,000 ohms, the foregoing AC analysis results in a substantially constant plate current as represented by a load line 1700 in FIG. 17 and as represented by data in a table 1800 in FIG. 18. For example, increasing the plate voltage by 20 volts causes the load current $I_{LOAD}$ to increase to 5 milliamperes (e.g., $\Delta I_{LOAD}=5$ milliamperes) flowing into the primary winding from the plate terminal (current summing node) 418. As before, the SCS provides an increased current $I_{SCS}$ of 5 milliamperes (e.g., $\Delta I_{SCS}=5$ milliamperes) into the current summing node, which balances he load current flowing away from the current summing node. Thus, the plate current does not change and remains at 75 milliamperes. In a similar manner, a decrease in the plate voltage of 20 volts causes the load current to have a magnitude of 5 milliamperes flowing from the primary winding toward the current summing node. The change in plate voltage causes the SCS to produce a decreased output current $I_{SCS}$ that changes by 5 milliamperes (e.g., $\Delta I_{SCS}=-5$ milliamperes). This negative change in current, which flows away from the current summing node, balances the change in current from the primary winding that flows into the current summing node such that the plate current does not change and remains at 75 milliamperes. Accordingly, the load line 1700 in FIG. 17 is substantially horizontal. This can also be understood using Equation (7) wherein the total load on the plate $R_{TOTAL}=1/[(1/-4000)+(1/4000)]$. The equation results in a division by 0, which results in an infinite AC load on the plate. Accordingly, the AC current through the plate is zero, which results in no change in the plate current over the entire AC voltage swing.

The negative resistance (−4,000 ohms) of $R_{SCS}$ can also be used to explain the slope of the load line 800 in FIG. 8 for the open load condition (e.g., $R_{PRIM}=\infty$). From Equation (7), $R_{TOTAL}=1/[(-1/4000)+(1/\infty)]=-4000$ ohms. The negative value for the total resistance causes the load line 800 to have the opposite slope from the load line 1300 in FIG. 13. Thus, the plate current for the open load condition increases with increasing voltage as described above with respect to FIG. 8.

Figure 19:
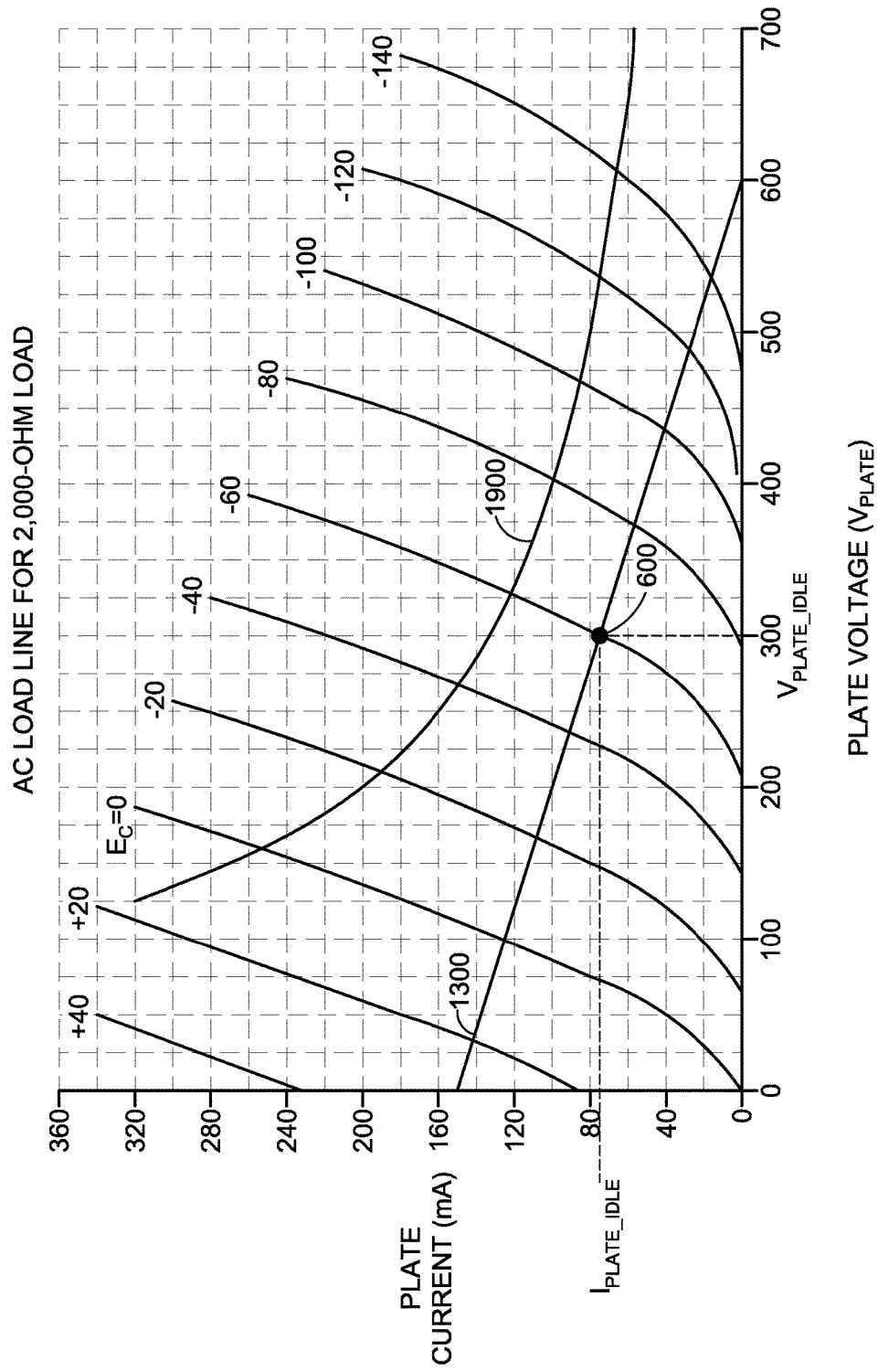
FIG. 19 illustrates the AC load line for a 2,000-ohm load as shown in FIG. 13 with a 40-watt maximum vacuum tube dissipation curve superimposed on the characteristic curves to illustrate the substantial displacement of the vacuum tube dissipation of the topology of FIG. 4 from the maximum dissipation.

A benefit of the combination of the current steering source (CSC) 460 and the vacuum tube 410 is to enable the vacuum tube circuit to provide increased power to the load (e.g., the loudspeaker 452) while operating the vacuum tube well within safe operating limitations. The 300B vacuum tube illustrated herein has a maximum safe power dissipation of 40 watts, which is illustrated by a curved line 1900 on the load lines reproduced in FIG. 19. The curved line can be considered as the upper boundary of the safe operating area (SOA) wherein the product of the plate voltage times the plate current does not exceed 40 watts. As shown in FIG. 19, the load line 1300 from FIG. 13 is well within the safe operating area. The previously known circuit topologies illustrated in FIGS. 1, 2 and 3 can also operate a 300B vacuum tube within the safe operating area; however, it can be shown that the typical maximum power transferred to the load by the previously known topologies is around 10 watts. Trying to drive the 300B vacuum tube to transfer greater power to the load with one of the circuits 100, 200, 300 of FIGS. 1, 2 and 3 may cause the average power dissipation of the vacuum tube to approach or exceed the 40-watt dissipation boundary.

Figure 2:
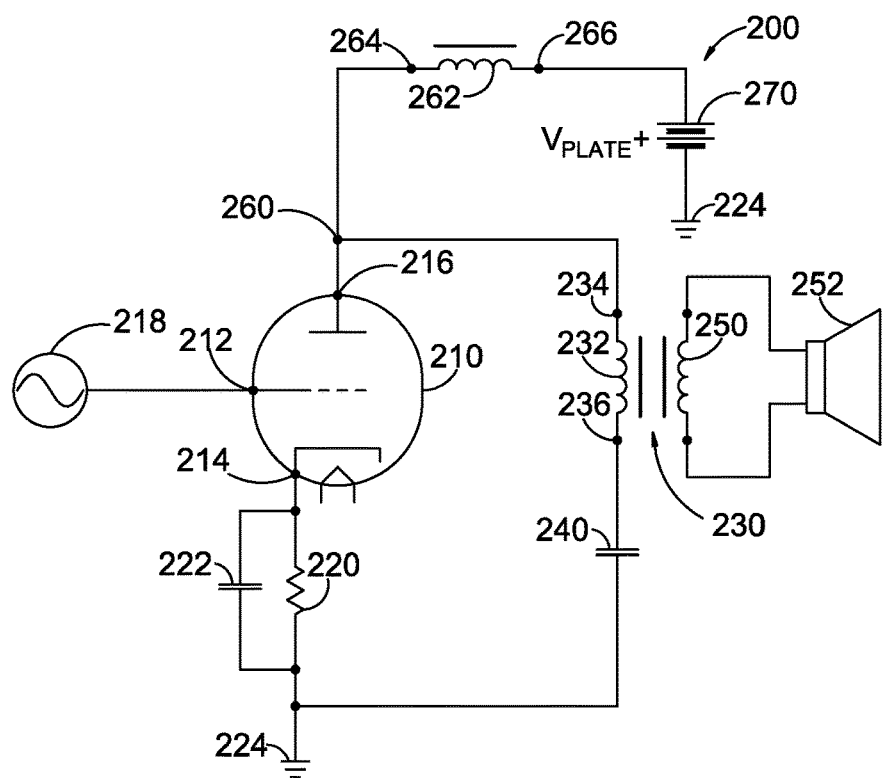
FIG. 2 illustrates a conventional single-ended Class-A amplifier topology having a triode vacuum tube with a plate (anode) terminal connected to a voltage source via an inductor and having the primary winding of an output transformer AC-coupled to the plate terminal.
Figure 3:
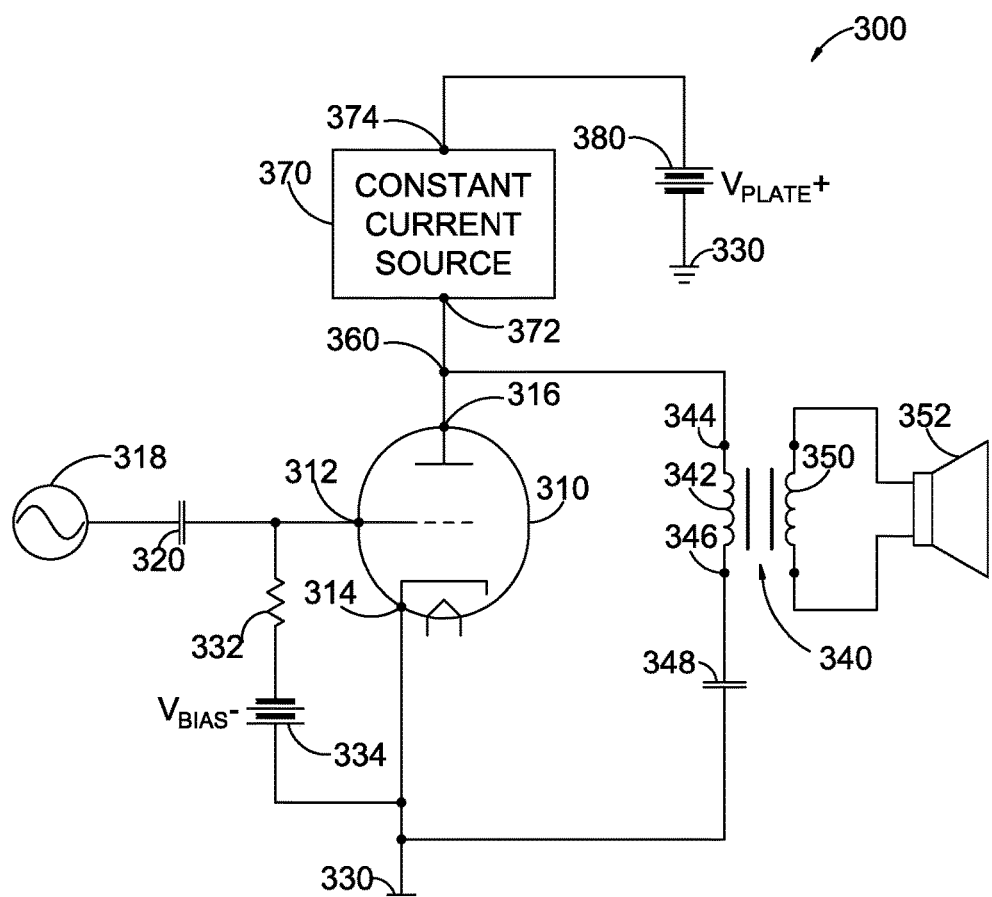
FIG. 3 illustrates a conventional single-ended Class-A amplifier topology having a triode vacuum tube with a plate terminal connected to a voltage source via a constant current source and having the primary winding of an output transformer AC-coupled to the plate terminal.

Unlike the circuits 100, 200, 300 of FIGS. 1, 2 and 3, the circuit 400 of FIG. 4 with the steered current source (SCS) 460 transfers significantly greater power to the load without stressing the 300B vacuum tube. As illustrated by the load line 1300 in FIGS. 13 and 18, at a plate voltage of 0 volts, the vacuum tube 410 draws 150 milliamperes of current into the plate terminal 418. The vacuum tube transfers the plate current to the circuit ground reference 422 via the cathode terminal 414. From Equation (3), a plate voltage of 0 volts causes the steered current $I_{SCS}$ from the SCS to be 0 milliamperes. Thus, the entire 150 milliamperes of plate current is drawn out of the load (e.g., the primary winding 442 of the power output transformer 450). The vacuum tube does not have to conduct current from the SCS when the plate voltage is 0 volts.

When the plate voltage is at a maximum voltage of 600 volts, the plate current is 0 milliamperes, and the steered current $I_{SCS}$ provided by the SCS 460 is 150 milliamperes. The steered current is provided to the load (e.g., the primary winding 442 of the power output transformer 440) with no contribution to the load current from the vacuum tube.

For the circuit 400 of FIG. 4, the peak negative load current $-I_{PEAK\_LOAD}$ is −150 milliamperes at a plate voltage of 0 volts. The peak positive load current $+I_{PEAK\_LOAD}$ is +150 milliamperes at a plate voltage of 600 volts. Thus, $I_{PEAK-LOAD}$ is ±150 milliamperes. For a sinewave audio output signal, the RMS value of the load current $I_{LOAD}$ provided to the load is 150 milliamperes divided by $\sqrt{2}$, which equates to approximately 1.06 milliamperes RMS. The power provided to the load is calculated as the RMS current squared times the resistance (e.g., $(150/\sqrt{2})^2 \times 2000$), which is approximately 22.5 watts. Accordingly, the power applied to the load is over twice the power applied to the load under similar operating conditions for a previously known single-ended amplifier circuit topology using a corresponding vacuum tube. As discussed above, the power is provided to the load while operating the vacuum tube 410 along the load line 1300, which is well within the safe operating range of 40 watts as illustrated by the SOA line 1900 in FIG. 19.

Figure 20:
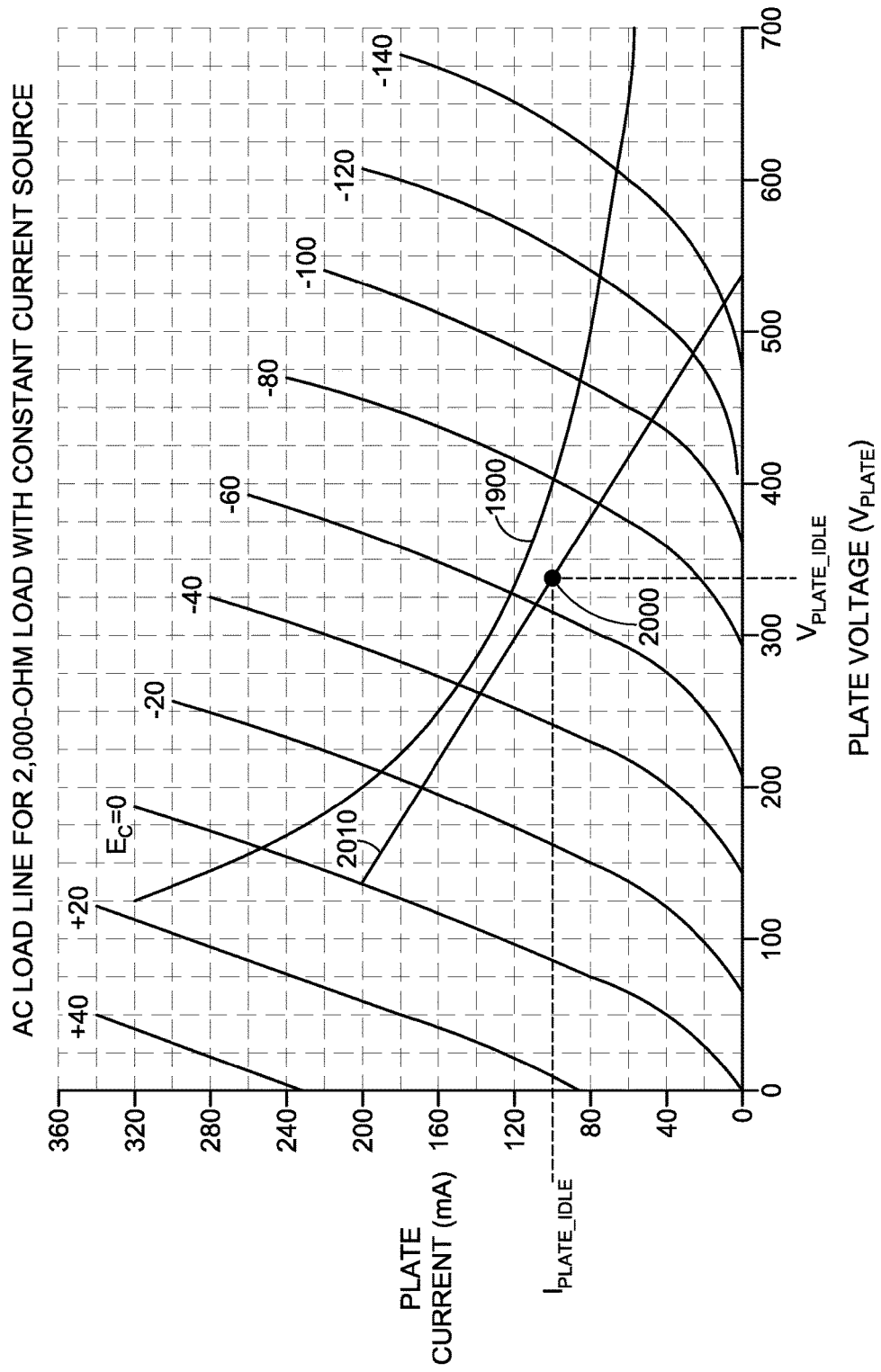
FIG. 20 illustrates the 40-watt maximum vacuum dissipation curve of FIG. 19 with an AC load line for the topology of FIG. 3 superimposed on the characteristic curves to show the reduced displacement of the vacuum tube dissipation from the maximum dissipation and further showing the reduced plate voltage swing available to maintain the plate current within a maximum limit.

The foregoing analysis can be compared with the analysis for a typical constant current plate supply such as the supply illustrated in FIG. 3. To achieve near maximum power output provided to the load (e.g., the primary winding 342 in FIG. 3), the circuit is operated with an idle plate voltage of 337.5 volts and with an idle plate current of 100 milliamperes as represented by an idle point 2000. At a plate voltage of 137.5 volts, the plate current is 200 milliamperes. At a plate voltage of 537.5 volts, the plate current is 0 milliamperes. Because of the constant current provided at the plate terminal 316, the plate voltage and the plate current can be represented by a load line 2010 in FIG. 20 that varies from a plate voltage of 137.5 volts and a plate current of 200 milliamperes to a plate voltage of 537.5 volts and a plate current of 0 milliampere. The plate voltage must be maintained at or above 137.5 volts to preclude the plate current from exceeding a maximum recommended peak current of 200 milliamperes. Since the current provided by the constant current source 370 in FIG. 3 is a constant 100 milliamperes, the current provided to the load (e.g., the primary winding) varies ±100 milliamperes with respect to idle condition. Accordingly, the power applied to the load can be calculated as $(100\sqrt{2})^2 \times 2000 = 10$ watts. The power transferred to the load is much lower than the power transferred to the load by the steered current source-based circuit 400 in FIG. 4. Furthermore, the conventional constant current source-based circuit 300 of FIG. 3 operates much closer to the safe operating area represented by the line 1900 of FIG. 19, and also operates with a higher maximum plate current (e.g., 200 milliamperes versus 150 milliamperes).

Although described above with respect to the vacuum tube 400 as the amplifying component, the steered current source 460 may also be used to drive a load with increased power using other amplification components. For example, the vacuum tube may be replace with a FET or other semiconductor amplifier with suitable modifications to the other components.

The previous detailed description has been provided for the purposes of illustration and description. Thus, although there have been described particular embodiments of a new and useful invention, it is not intended that such references be construed as limitations upon the scope of this invention except as set forth in the following claims.

What is claimed is:

1. A steered current source for a class-A single-ended amplifier having an amplification component that produces a time-varying amplified output voltage on an output terminal in response to an input signal on a control terminal, the output terminal AC-coupled to a load, the steered current source comprising:
   an input section coupled to the output terminal of the amplification component, the input section receiving the output voltage produced by the amplification component and producing a control signal responsive to the output voltage; and
   an output section that generates a steered current responsive to the control signal produced by the input section, the steered current provided to the output terminal of the amplification component, the steered current increasing in response to the output voltage increasing, the steered current decreasing in response to the output voltage decreasing.

2. The steered current source as defined in claim 1, wherein:
   the input section produces a first current proportional to the output voltage of the amplification component;
   the control signal is an input section voltage proportional to the first current; and
   the steered current is proportional to the input section voltage such that the steered current provided to the output terminal of the amplification component is proportional to the output voltage of the amplification component.

3. The steered current source as defined in claim 2, wherein:
   the input section of the steered current source comprises:
      a first transistor having a control input terminal, a first controlled terminal and a second controlled terminal, the control input terminal coupled to the output terminal of the amplification component, the first controlled terminal coupled to a first resistor to produce a first voltage across the first resistor proportional to the output voltage on the output terminal of the amplification component and to produce a first current through the first resistor proportional to the first voltage, the first current flowing between the first and second controlled terminals of the first transistor; and
      a second resistor coupled to the second controlled terminal of the first transistor to receive the first current, the second resistor producing the input section voltage proportional to the first current;
   and
   the output section of the steered current source comprises:
      a second transistor having a control input terminal, a first controlled terminal and a second controlled terminal, the control input terminal of the second transistor coupled to receive the input section voltage, the first controlled terminal of the second transistor coupled to a third resistor to reproduce the input section voltage across the third resistor, the third resistor producing the steered current proportional to the input section voltage, the steered current propagating through the second transistor from the first controlled terminal to the second controlled terminal and to the output terminal of the amplification component.

4. The steered current source as defined in claim 3, wherein the first transistor comprises at least one n-channel enhancement mode metal oxide semiconductor field effect transistor (MOSFET), and the second transistor comprises at least one p-channel enhancement mode MOSFET.

5. The steered current source as defined in claim 1, wherein the amplification component comprises a vacuum tube having at least a cathode, an anode and a grid, and wherein the output terminal is the anode of the vacuum tube.

6. A method for increasing the power provided to an AC-coupled load from a class-A single-ended amplifier having an amplification component responsive to an input signal to produce a time-varying amplified output voltage on an output terminal connected to the load, the method comprising:
   coupling the output voltage from the output terminal of the amplification component to the input of a steered current source;
   generating a steered current within the steered current source, the steered current proportional to the output voltage from the output terminal of the amplification component; and
   coupling the steered current to the output terminal of the amplification component to provide at least a portion of the steered current to the load.

7. The method as defined in claim 6, wherein the amplification component has an amplifier current that flows from the output terminal through the amplification component to a reference voltage, the method further comprising;

increasing the steered current from the steered current source and decreasing the amplifier current when the output voltage increases; and decreasing the steered current from the steered current source and increasing the amplifier current when the output voltage decreases.

8. The method as defined in claim 7, wherein:

the output voltage of the amplification component has an idle voltage magnitude;

the amplifier current has an idle current magnitude when the output voltage of the amplification component is at the idle voltage magnitude;

the magnitude of the amplifier current decreases below the idle current magnitude when the magnitude of the output voltage increases above the idle voltage magnitude; and the magnitude of the amplifier current increases above the idle current magnitude when the magnitude of the output voltage decreases below the idle voltage magnitude.

9. A single-ended Class-A amplifier comprising:

an amplification component having at least an output terminal, a reference terminal and a control terminal, the control terminal receiving a time-varying input signal, the amplification component responsive to the time-varying input signal to vary an output voltage on the output terminal and to vary a current flowing between the output terminal and the reference terminal;

a load AC-coupled to the output terminal of the amplification component;

a steered current source having a voltage input coupled to the output terminal of the amplification component and having a steered current output coupled to the output terminal of the amplification component, the steered current source configured to increase the steered current to provide current to the load when the output voltage on the output terminal of the amplification component increases and to decrease the steered current output when the output voltage on the output terminal of the amplification component decreases.

10. The single-ended Class-A amplifier as defined in claim 9, wherein the amplification component is a vacuum tube, wherein the control terminal is a grid terminal, wherein the output terminal is an anode terminal, and wherein the reference terminal is a cathode terminal.

11. The single-ended Class-A amplifier as defined in claim 9, wherein the load is the primary winding of an output transformer, the output transformer having a secondary winding coupled to an audio transducer.

12. The single-ended Class-A amplifier as defined in claim 9, wherein:

the DC current flowing through the amplification component increases with increasing DC voltage on the output terminal, and the AC current flowing through the amplification current decreases with increasing AC voltage on the output terminal.

* * * * *

UNITED STATES PATENT AND TRADEMARK OFFICE
CERTIFICATE OF CORRECTION

Page 1 of 2

PATENT NO.         : 10,256,776 B1
APPLICATION NO.    : 16/116015
DATED              : April 9, 2019
INVENTOR(S)        : Guenther Mania et al.

It is certified that error appears in the above-identified patent and that said Letters Patent is hereby corrected as shown below:

In the Drawings

On Sheet 3, Fig. 5 should appear as follows with the second occurrence of "540A" replaced with --540C--; as shown on the attached drawing sheet.

In the Specification

In Column 15 at Line 60, change "Equation (4):" to --Equation (3b)--.

In Column 15 at Line 62, change the parenthetical number at the end of the line from "(3)" to --(3b)--.

In the Claims

In Claim 12 at Line 6 (Column 22 at Line 25), change "amplification current" to --amplification component--.

Signed and Sealed this
Seventh Day of January, 2020

Andrei Iancu
*Director of the United States Patent and Trademark Office*